(12) United States Patent
Wang et al.

(10) Patent No.: US 11,532,264 B2
(45) Date of Patent: Dec. 20, 2022

(54) DRIVING BACKPLANE AND METHOD FOR MANUFACTURING THE SAME, AND DISPLAY PANEL

(71) Applicant: BOE TECHNOLOGY GROUP CO., LTD., Beijing (CN)

(72) Inventors: Ke Wang, Beijing (CN); Zhanfeng Cao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 105 days.

(21) Appl. No.: 17/081,834

(22) Filed: Oct. 27, 2020

(65) Prior Publication Data

US 2021/0125549 A1 Apr. 29, 2021

(30) Foreign Application Priority Data

Oct. 28, 2019 (CN) .......................... 201911032427.9

(51) Int. Cl.
*G09G 3/32* (2016.01)
*H01L 33/38* (2010.01)
*H01L 33/00* (2010.01)

(52) U.S. Cl.
CPC ............. *G09G 3/32* (2013.01); *H01L 33/005* (2013.01); *H01L 33/382* (2013.01); *G09G 2300/0426* (2013.01); *H01L 2933/0016* (2013.01)

(58) Field of Classification Search
CPC .............. G09G 3/32; G09G 2300/0426; H01L 33/005; H01L 33/382; H01L 2933/0016; H01L 33/62; H01L 25/0753; H01L 27/156
See application file for complete search history.

(56) References Cited

U.S. PATENT DOCUMENTS

2013/0056784 A1* 3/2013 Lee ..................... H01L 27/3246
438/22
2019/0157341 A1 5/2019 Chang et al.

FOREIGN PATENT DOCUMENTS

| CN | 207116748 U | 3/2018 |
| CN | 107887403 A | 4/2018 |
| CN | 208444838 U | 1/2019 |
| CN | 109887950 A | 6/2019 |
| CN | 109904186 A | 6/2019 |
| CN | 109949709 A | 6/2019 |
| WO | 2020173049 A1 | 9/2020 |

OTHER PUBLICATIONS

Office Action dated Dec. 28, 2020 in corresponding CN Patent Application No. 201911032427.9, 16 pages.
Notification to Grant Patent Right for Invention dated Apr. 2, 2021 in corresponding CN Patent Application No. 201911032427.9, 7 pages.

* cited by examiner

*Primary Examiner* — Andrew Sasinowski
(74) *Attorney, Agent, or Firm* — Procopio, Cory, Hargreaves & Savitch LLP

(57) ABSTRACT

A driving backplane includes a base, electroplating electrodes and driving electrodes. The base has first through holes in a sub-pixel region. The electroplating electrodes are disposed in the sub-pixel region, and at least a portion of each electroplating electrode is disposed within a respective one of the first through holes. The driving electrodes are disposed in the sub-pixel region and on a first side of the base, and each driving electrode is connected to a respective one of the electroplating electrodes.

17 Claims, 13 Drawing Sheets

DRIVING BACKPLANE AND METHOD FOR MANUFACTURING THE SAME, AND DISPLAY PANEL

CROSS-REFERENCE TO RELATED APPLICATION

This application claims priority to Chinese Patent Application No, 201911032427.9 filed on Oct. 28, 2019, which is incorporated herein by reference in its entirety.

TECHNICAL FIELD

The present disclosure relates to the field of display technologies, and in particular, to a driving backplane and a method for manufacturing the same, and a display panel.

BACKGROUND

In a mini light-emitting diode (Mini-LED) display device, a dimension of an LED ranges from approximately 100 µm to approximately 200 µm, and the LED may be addressed and driven to emit light separately. The Mini-LED display device has advantages of high luminous efficiency, high brightness, high contrast, fast response speed, small volume, being light and thin, and low power consumption.

SUMMARY

In one aspect, a driving backplane is provided. The driving backplane includes a base, electroplating electrodes and driving electrodes. The base has first through holes in a sub-pixel region. The electroplating electrodes are disposed in the sub-pixel region, and each electroplating electrode is disposed within a respective one of the first through holes. The driving electrodes are disposed in the sub-pixel region and on a first side of the base, and each driving electrode is connected to a respective one of the electroplating electrodes.

In some embodiments, the electroplating electrode includes a first electroplating sub-electrode disposed within the first through hole and a second electroplating sub-electrode disposed on a surface, at a second side opposite to the first side, of the base. The first electroplating sub-electrode and the second electroplating sub-electrode are directly connected. An orthographic projection of the first electroplating sub-electrode on a plane where the surface of the base is located is within an orthographic projection of the second electroplating sub-electrode on the plane.

In some embodiments, the driving backplane further includes an insulating layer disposed on a surface, at the first side, of the base. The insulating layer includes via holes, penetrating the insulating layer, in the sub-pixel region, and each driving electrode is disposed within a respective one of the via holes.

In some embodiments, the driving electrodes include a first electrode and a second electrode that are disposed in different layers.

In some embodiments, the driving backplane further includes a first insulating layer disposed on the first side of the base. The first insulating layer includes, a second through hole and a third through hole that are in the sub-pixel region. The first electrode is disposed within the second through hole and is connected to a corresponding electroplating electrode. The second electrode is connected to another corresponding electroplating electrode through the third through hole.

In some embodiments, the first electrode includes a sub-electrode and a second sub-electrode that are sequentially arranged in a direction away from the base and the first sub-electrode is connected to the corresponding electroplating electrode. An orthographic projection a respective first through hole on a plane where a surface, at the first side, of the base is located is within an orthographic projection of the first sub-electrode on the plane.

In some embodiments the second electrode includes a third sub-electrode and a fourth sub-electrode that are sequentially arranged in a direction away from the base. The third sub-electrode is connected to the another corresponding electroplating electrode through the third through hole.

In some embodiments the third sub-electrode includes a first portion and a second portion that are directly connected. The first portion is located on a surface of the first insulating layer facing away from the base, and the second portion is located in the third through hole. The first portion of the third sub-electrode is in direct contact with the fourth sub-electrode, and the second portion of the third sub-electrode is in direct contact with the another corresponding electroplating electrode.

In some embodiments, the first insulating layer includes a first insulating sub-layer and a second insulating sub-layer that are sequentially arranged in the direction away from the base. In the direction away from the base, a surface of the first electrodes facing away from the base is lower than a surface of the second insulating sub-layer facing away from the base, and the first portion of the third sub-electrode is disposed on the surface of the second insulating sub-layer facing away from the base.

In some embodiments, the driving backplane further includes a second insulating layer disposed on a surface of the first insulating layer facing away from the base. The second insulating layer includes a fourth through hole that is in the sub-pixel region A portion of the second electrode is disposed within the fourth through hole and a remaining portion of the second electrode is disposed within the third through hole.

In some embodiments, the second insulating layer includes a third insulating sub-layer and a fourth insulating sub-layer that are sequentially arranged in a direction away from the base. In the direction away from the base, a surface, facing away from the base, of the portion of the second electrode disposed within the fourth through hole is lower than a surface of the fourth insulating sub-layer facing away from the base.

In some embodiments, the second, insulating layer further includes a fifth through hole that is in the sub-pixel region. The fifth through hole is connected to the second through hole. The driving backplane further includes a first conductive adhesive pattern and a second conductive adhesive pattern that are in the sub-pixel region. The first conductive adhesive pattern is disposed within the fourth through hole, and is in direct contact with a surface of the second electrode facing away from the base. The second conductive adhesive pattern is disposed within the fifth through hole, and is in direct contact with a surface of the first electrode facing away from the base.

In some embodiments, the first through holes in the sub-pixel region include two first through holes, and the driving electrodes in the sub-pixel region are the first electrode and the second electrode.

In another aspect, a display panel is provided. The display panel includes the driving backplane described in any one of the above embodiments and at least one light-emitting device. The light-emitting device is disposed in the sub-pixel region on the driving backplane. Each light-emitting device is connected to corresponding driving electrodes.

In yet another aspect, a method for manufacturing the driving backplane is provided. The method includes: forming the first through holes in the sub-pixel region in the base; forming the electroplating electrodes in the sub-pixel region, and at least a portion of each electroplating electrode is formed in a respective one of the first through hole; and forming the driving electrodes in the sub-pixel region on the first side of the base by using an electroplating process through the electroplating electrodes.

In some embodiments, forming the electroplating electrodes includes: by using a magnetron sputtering process, forming electroplating electrode seed layers each both on an inner wall of a corresponding first through hole and in a region that surrounds the corresponding first through hole on a surface, at a second side opposite to the first side, of the base; and forming electroplating deposition portions each in a corresponding first through hole by using a first electroplating process through the electroplating electrode seed layers.

In some embodiments, forming the driving electrodes includes forming a first electrode. Forming the first electrode includes: forming a metal film through a second magnetron sputtering process on a surface, at the first side, of the base; performing a first patterning process on the metal film to form a first sub-electrode; forming a first insulating film on a side of the first sub-electrode away from the base; performing a second patterning process on the first insulating film to form a second through hole that is in the sub-pixel region, so as to obtain a first insulating film having the second through hole that is in the sub-pixel region; and forming a second sub-electrode in the second through hole by using a second electroplating process through a corresponding electroplating electrode and the first sub-electrode. An orthographic projection of a respective first through hole on a plane where a surface, at the first side, of the base is located is within an orthographic projection of the first sub-electrode on the plane.

In some embodiments, forming the driving electrodes further includes forming a second electrode, Forming the second electrode includes: performing at least one third patterning process on the first insulating film and a second insulating film to form, in the sub-pixel region, a first via hole passing through the first insulating film and a second via hole passing through the second insulating film, so as to obtain a first insulating sub-layer, the first via hole and the second via hole constitute a third through hole; forming a third sub-electrode through a third magnetron sputtering process both on an inner wall of the third through hole and in a region that is on a periphery of the third through hole on the second insulating film; forming a third insulating film on a side of the third sub-electrode away from the base; performing a fourth patterning process on the third insulating film to form, in the sub-pixel region, a third via hole passing through the third insulating film, so as to obtain a third insulating film having the third via hole; and forming a fourth sub-electrode in the third via hole by using a third electroplating process through the third sub-electrode and a corresponding electroplating electrode.

In some embodiments, before the third sub-electrode is formed through the third magnetron sputtering process, the method further includes: forming a second insulating film on the first insulating film. Performing at least one third patterning process on the first insulating film and the second insulating film includes: performing one third patterning process on the first insulating film and the second insulating film, so as to obtain a second insulating sub-layer.

In some embodiments, after the fourth sub-electrode is formed, the method further includes: forming a fourth insulating film on the third insulating film; performing at least one fifth patterning process on the fourth insulating film and the third insulating film to form, in the sub-pixel region, a fifth through hole passing through both the third insulating film and the fourth insulting film and a fourth via hole passing through the fourth insulating film; and forming a second conductive adhesive pattern in the fifth through hole on the first electrode, and a first conductive adhesive pattern in a fourth via hole on the second electrode. The fourth via hole is constituted by the third via hole and a fourth via hole.

BRIEF DESCRIPTION OF THE DRAWINGS

In order to describe technical solutions in the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals that the embodiments of the present disclosure relate to.

DETAILED DESCRIPTION

Figure 1:
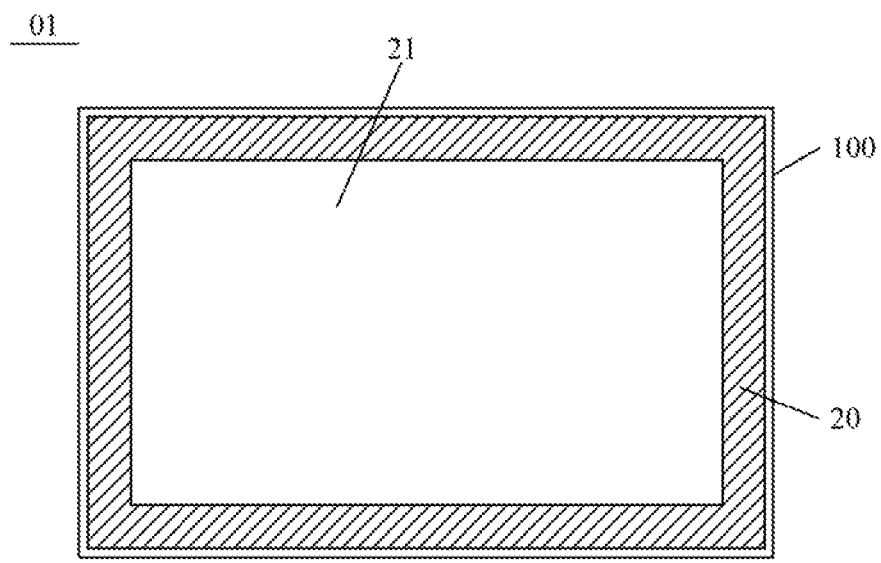
FIG. 1 is a top view of a driving backplane in the related art.

Technical solutions in some embodiments of the present disclosure will be described clearly and completely with reference to the accompanying drawings. However, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the specification, the term "comprise" and other forms thereof, such as, the third-person singular form "comprises" and the present participle form "comprising" are construed as open and inclusive sense, i.e., "including, but not limited to". In the description of the specification, the terms such as "one embodiment", "some embodiments", "exemplary embodiments", "example", "specific example" or "some examples", and the like are intended to indicate that specific features, structures, materials or characteristics related to the embodiment(s) or the example(s) are included in at least one embodiment or example of the present disclosure. Schematic expressions of the above terms do not necessarily refer to the same embodiment(s) or example(s). In addition, the specific features, structures, materials or characteristics may be included in any one or more embodiments or examples in any suitable manner.

As used herein, the singular form "a" and "an" are intended to include the plural forms as well, unless the context clearly indicates otherwise. The terms such as "first" and "second" are used for descriptive purposes only, and are not to be construed as indicating or implying the relative importance or implicitly indicating the number of indicated technical features. Thus, features defined by the term "first" or "second" may explicitly or implicitly include one or more of the features. In the description of the embodiments of the present disclosure, the terms "a plurality of", "the plurality of", and "multiple" mean two or more unless otherwise specified.

"Approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system), For example, "approximately" can mean within one or more standard deviations, or within ±30%, 20%, 10% or 5% of the stated value.

When elements are referred to as being "connected" or "coupled", the elements can be directly connected or coupled together or one or more intervening elements may also be present. In contrast, when elements are referred to as being "directly connected" or "directly coupled", there are no intervening elements present.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present, in addition, it will also be understood that when a layer is referred to as being "between" two layers, it can be the only layer between the two layers, or one or more intervening layers may also be present. Like reference numerals refer to like elements throughout.

Furthermore, the expression "at least one of A, B, and C" include the following combinations of A, B, and C: only A, only B, only C, a combination of A and B, a combination of A and C, a combination of B and C, and a combination of A, B, and C.

It will be noted that, in the specification, the same layer means that a film is formed by the same film forming process and then is patterned by one patterning process using the same mask. Depending on the different specific patterns in the layer, the patterning process herein may include a photolithography process, or a process including a photolithography process and an etching process. The photolithography process refers to a process that includes a film formation (for example, a film formation by chemical vapor deposition (CVD), sputtering, or evaporation), an exposure, a development, and the like, and that forms a pattern by using a photoresist, a mask, an exposure machine, and the like. The specific patterns may be continuous or discontinuous, and may also be at different heights or have different thicknesses.

As shown in FIG. 1, in the related art, a passive matrix driving backplane 01 has an electroplating region 20 and an electrode region 21. The passive matrix driving backplane 01 includes a base 100 having two opposite surfaces, and a plurality of driving electrodes disposed in the electrode region 21 on the base 100, for driving sub-pixels on the backplane 01 to emit light.

In a process of forming the driving electrode, since a thickness of the driving, electrodes is large (usually greater than 1 μm), it is difficult to deposit a metal layer with a thickness of more than 1 μm by using a magnetron sputtering process. That is to say, it is difficult to form an electrode that meets the thickness requirement only by using the magnetron sputtering process. Therefore, in a process of manufacturing the backplane 01, both the magnetron sputtering process and an electroplating process are used to form, a metal layer with a large thickness, e.g., the driving electrodes.

In this case, a plurality of electroplating electrodes are formed firstly in the electroplating region 20 by using the magnetron sputtering process, and then voltages are applied to the electroplating electrodes to form the driving electrodes in the electrode region 21 through the electroplating process. Herein, the electroplating electrodes and the driving electrodes formed after the electroplating electrodes are located on a same surface of the base 100. Since the electroplating electrodes are only used for the electroplating process so as to form the driving electrodes in the electrode region 21, after the driving electrodes are formed, the electroplating electrodes need to be cut away. In the above technical solution, the electroplating region 20 may reduce an effective area and a utilization rate of the base 100, and thus cause a waste of a material of the base 100.

Figure 21:
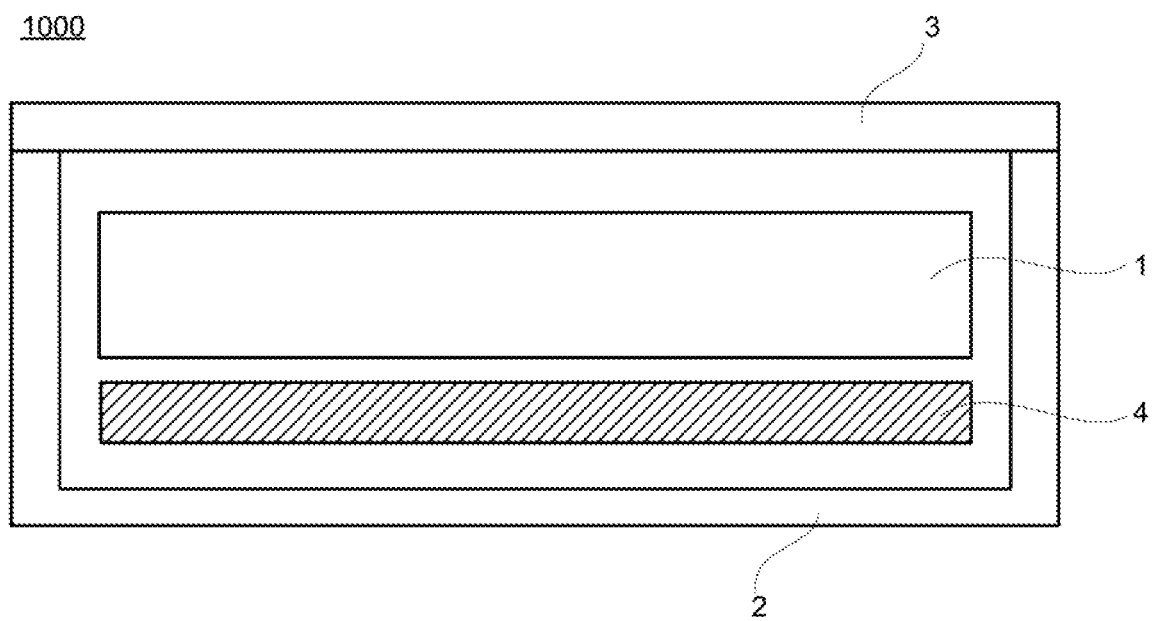
FIG. 21 is a schematic diagram of a display apparatus, in accordance with some embodiments of the present disclosure.

Some embodiments of the present disclosure provide a display apparatus 1000. As shown in FIG. 21, the display apparatus 1000 may include a display panel 1, a frame 2, a cover plate 3, and a circuit board 4. The frame 2 has an accommodating space inside. The display panel 1, the circuit board 4 and other electronic components are arranged in the accommodating space, and the cover plate 3 is provided at an opening of the frame 2. The display panel 1 is disposed closer to the cover plate 3 relative to the circuit board 4. It may be understood that the display apparatus 1000 may include fewer or more components, which may be set according to actual needs.

In some embodiments, the display apparatus 1000 may be any product or part having a display function, such as a mobile phone, a tablet personal computer, a television a display, a notebook computer, or a digital photo frame. The display apparatus 1000 may be also a wearable electronic device such as a smart watch, or a smart bracelet.

Figure 2:
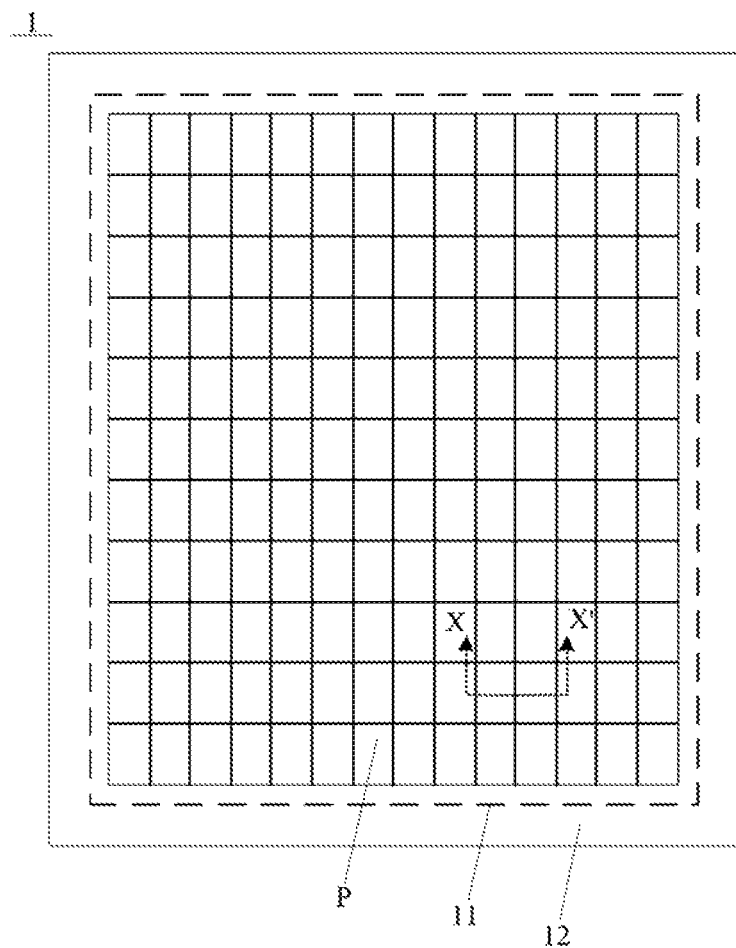
FIG. 2 is a top view of a display panel, in accordance with some embodiments of the present disclosure.

In some embodiments, as shown in FIG. 2, the display panel 1 has a display area (i.e., an active area) 11 and a peripheral area 12 located on a periphery of the display area 11. For example, the display area 11 is in a shape of a rectangle, and the peripheral area 12 may be located on one side, two sides, three sides, or all sides (as shown in FIG. 2) of the display area 11. Of course, the display area 11 may also have other shapes, such as a circular shape. In this case, the peripheral area 12 may surround the display area 11.

The display area 11 includes a plurality of sub-pixel regions P, and the plurality of sub-pixel regions P include sub-pixel regions of a plurality of colors. For example, the plurality of sub-pixel regions P include at least red sub-pixel regions, green sub-pixel regions, and blue sub-pixel regions. Each sub-pixel region P is a region where a sub-pixel (including at least one light-emitting device) is located, and the light-emitting device in a sub-pixel region may emit red light, green light or blue light.

In some examples, as shown in FIG. 2, the plurality of sub-pixel regions P are arranged in an array.

Figure 3:
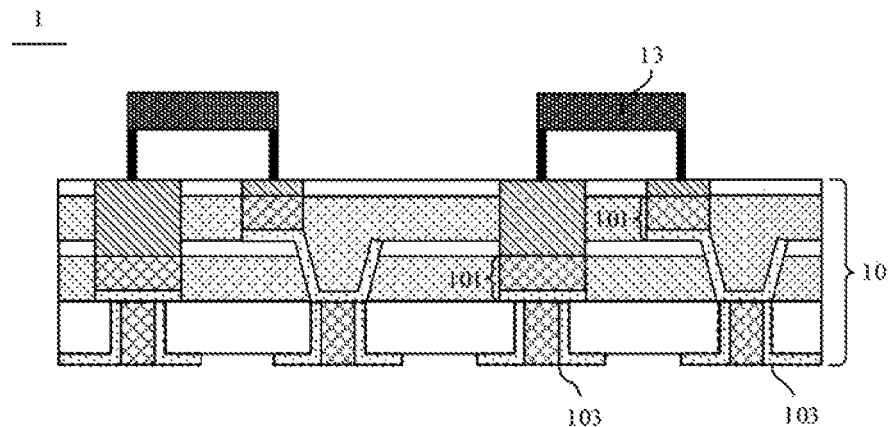
FIG. 3 is a cross-sectional view of the display panel in FIG. 2 along section line X-X'.

The peripheral area 12 is used for wiring. For example, a plurality of signal lines are provided in the peripheral area 12, for transmitting signals to light-emitting devices in the sub-pixel regions P so as to drive the light-emitting devices to emit light. As shown in FIG. 3, the display panel 1 includes a driving backplane 10 used for display, and the light-emitting devices disposed in the sub-pixel regions P on the driving backplane 10. The following is described by taking an example in which the light-emitting devices are light-emitting diodes (LEDs) 13, The LEDs 13 are connected to the driving backplane 10, so that the driving backplane 10 may provide signals, e.g., voltage signals, to the LEDs 13 to drive the LEDs 13 to emit light.

The structure of the driving backplane 10 will be described in detail in the following.

Figure 4A:
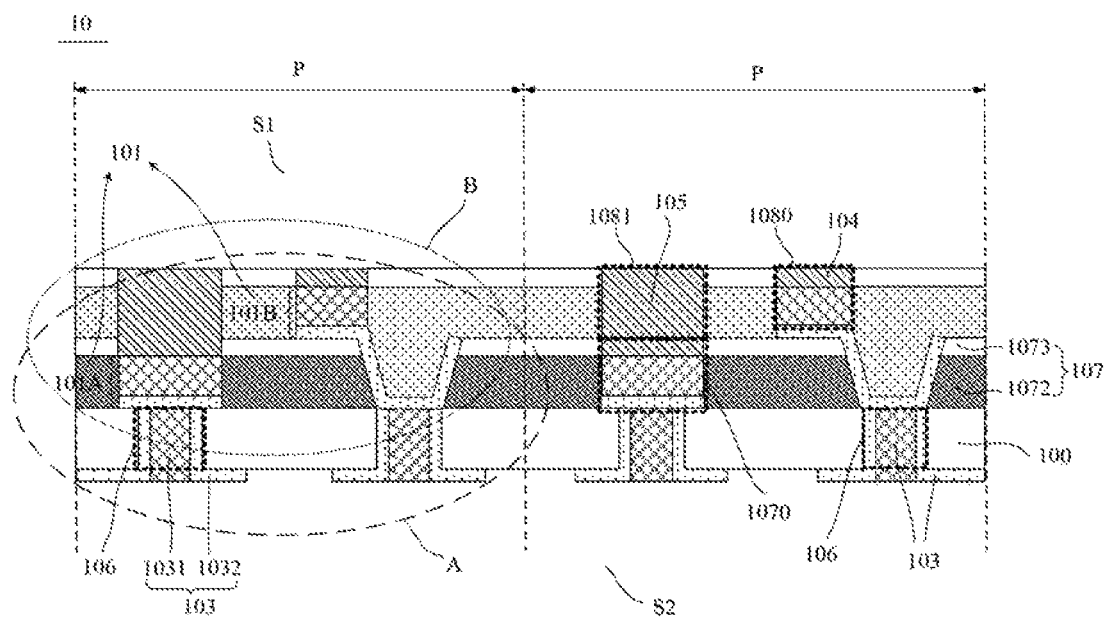
FIG. 4A is a schematic diagram of a driving backplane, in accordance with some embodiments of the present disclosure.
Figure 4B:
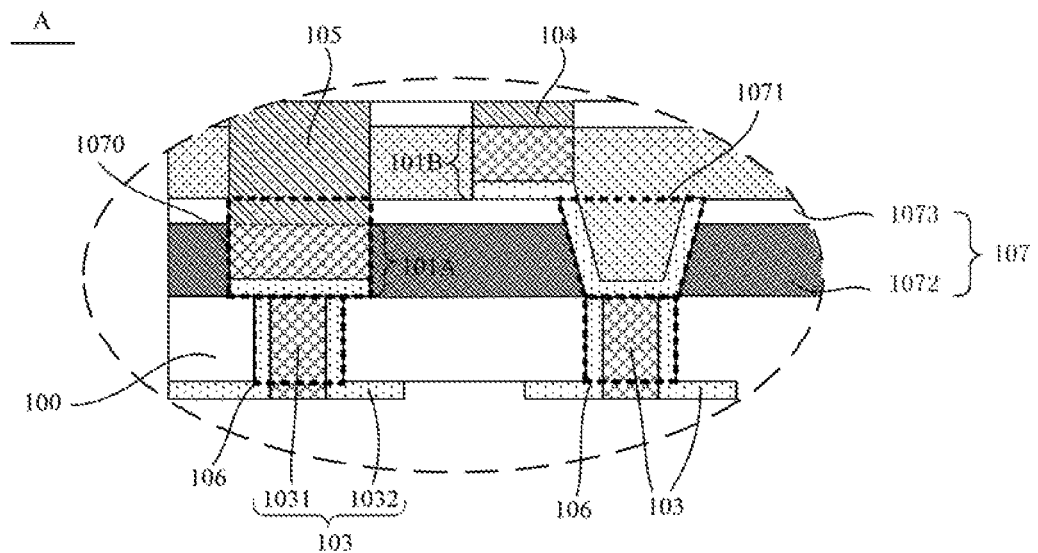
FIG. 4B is an enlarged view of the region A in FIG. 4A.

In some embodiments, as shown in FIGS. 4A and 4B, the driving backplane 10 includes a base 100. The driving backplane 10 has two opposite sides, i.e., a first side S1 and a second side 82, which are two sides of the base 100 in a thickness direction of the base 100. For example, the first side S1 may be a side of the base 100 proximate to a display surface of the display panel 1, and the second side S2 may be a side of the base 100 facing away from the display surface of the display panel 1.

As shown in FIGS. 4A and 48, the base 100 has a plurality of first through holes 106 in a sub-pixel region P. The driving backplane 10 further includes a plurality of electroplating electrodes 103 in the sub-pixel region P, which are arranged in one-to-one correspondence with the plurality of first through holes 106. Further, at least a portion of each electroplating electrode 103 is disposed within a corresponding first through hole 106.

It will be noted that, a size of the first through hole 106 may be set according to design requirements for a size of the electroplating electrode 103. In some examples, the first through hole 106 is of a cylinder shape, and the diameter of the first through hole 106 is approximately 100 μm to approximately 3000 μm, such as 100 μm, 500 μm, 1000 μm 1500 μm, 2000 μm, 2500 μm or 3000 μm.

In some embodiments, the base 100 is, for example, a glass base or a silicon base. In a case where the base 100 is the glass base, the first through holes 106 may be formed by etching the glass base with hydrofluoric acid or hydrogen peroxide, or may be formed by using a laser etching process.

As shown in FIGS. 4A and 48, the driving backplane 10 further includes a plurality of driving electrodes 101 disposed in the sub-pixel region P and on the first side 81 of the base 100. The driving electrodes 101 are in one-to-one correspondence with the electroplating electrodes 103, and each driving electrode 101 is connected to a corresponding electroplating electrode 103.

Herein, the driving electrodes 101 are used to supply power to the LED 13 of the display panel 1. In the process of forming the driving electrodes 101 using the electroplating process, the electroplating electrodes 103 may be connected to an external power supply to provide electroplating conditions for the electroplating process.

In some embodiments, as shown in FIGS. 4A, 4B, 5 and 6, a portion of the electroplating electrode 103 is disposed within a corresponding first through hole 106, The portion of the electroplating electrode 103 disposed within the corresponding first through hole 106 may be called a first electroplating sub-electrode 1031, and the other portion of the electroplating electrode 103 may be called a second electroplating sub-electrode 1032. That is, the electroplating electrode 103 includes a first electroplating sub-electrode 1031 and a second electroplating sub-electrode 1032 that are directly connected. It is easy to understand that, the first electroplating sub-electrode 1031 is the portion of the electroplating electrode 103 located within the first through hole 106, and the second electroplating sub-electrode 1032 is the portion located outside the first through hole 106.

Figure 5:
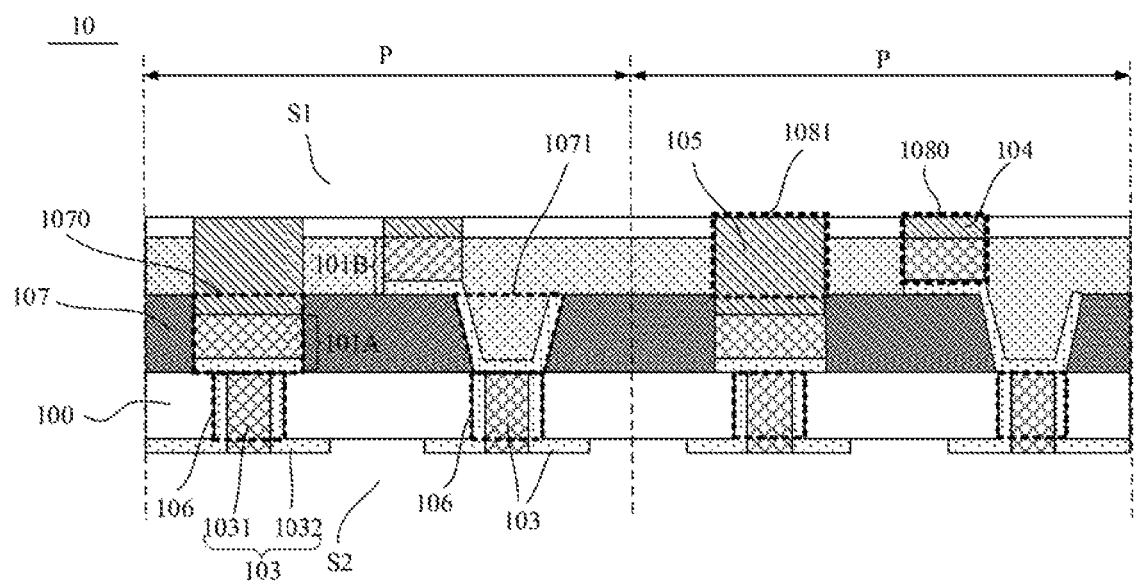
FIG. 5 is a schematic diagram of another driving backplane, in accordance with some embodiments of the present disclosure.

In some examples, as shown in FIGS. 4A, 4B, 5, the second electroplating sub-electrode 1032 is located on the second side S2 of the base 100. For example, the second electroplating sub-electrode 1032 is disposed on a surface, at the second side S2, of the base 100. An orthographic projection of the first electroplating sub-electrode 1031 on a plane where this surface of the base 100 is located is within an orthographic projection of the second electroplating sub-electrode 1032 on the plane. In this case, a cross-section of the electroplating electrode 103 has an "inverted T" shape.

In the electroplating process, the electroplating electrodes 103 may be connected to the external power supply through the second electroplating sub-electrode 1032. In some examples, by providing a second electroplating sub-electrode 1032 with a larger surface area, a yield of the electrical contact between the second electroplating sub-electrode 1032 and the external power supply may be increased thereby ensuring that the electroplating process may be performed successfully.

Figure 6:
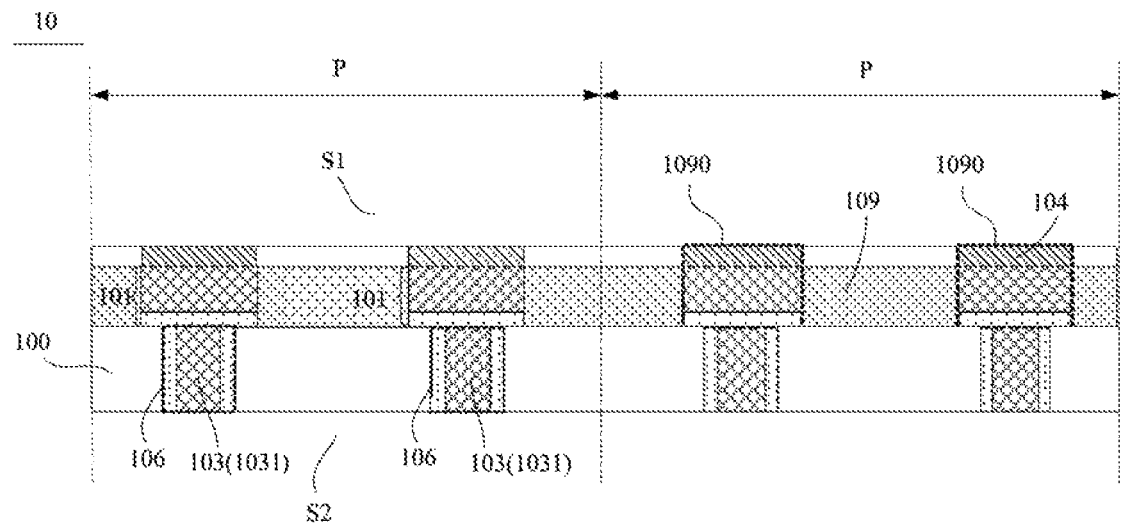
FIG. 6 is a schematic diagram of yet another driving backplane, in accordance with some embodiments of the present disclosure.

In some other embodiments, as shown in FIG. 6, the whole electroplating electrode 103 is disposed within the corresponding first through hole 106. That is, the electroplating electrode 103 only includes the first electroplating sub-electrode 1031, i.e., the portion located within the first through hole 106. In this case, the first electroplating sub-electrode 1031 is connected to the external power supply in the electroplating process.

In the driving backplane 10 provided by the embodiments described as above, at least a portion of the electroplating electrode 103 is disposed within the corresponding first through hole 106, so that the electroplating electrode 103 may be connected to a driving electrode 101 located on the first side S1 of the base 100. In this way, the electroplating electrode 103 and the driving electrode 101 may be stacked in the thickness direction of the base. That is to say, the electroplating electrode 103 and the driving electrode 101 are not disposed on a same side of the base 100. In this way, in the process of manufacturing the driving backplane 10, it is unnecessary to provide an electroplating region at a periphery of the display area, and thus the effective area and the utilization rate of the base 100 may be increased.

In addition, the driving backplane 10 may be a passive matrix driving backplane. During operation, the electroplating electrode 103 may function as a wire for receiving a signal (e.g., a voltage signal) and transmitting the signal to a corresponding driving electrode 101 to drive a corresponding LED 13 to emit light. In this case, the signal lines in the driving backplane 10 may be disposed on a surface, at the second side S2, of the base 100. In this way, the number of wires on a surface, at the first side S1, of the base 100 may be reduced, and thus the number of the sub-pixel regions P in the driving backplane 10, i.e., pixels per inch (PPI) of the driving backplane 10, may be increased.

In some embodiments, as shown in FIGS. 3 and 6, the LED 13 includes a positive electrode and a negative electrode, which are connected to different driving electrodes 101. For example, as shown in FIG. 3, the positive electrode and the negative electrode of the LED 13 may be connected to respective driving electrodes 101 through respective conductive media, for example, respective conductive adhesives. In some other embodiments, the positive electrode and the negative electrode of the LED 13 may be in direct contact with respective driving electrodes 101.

Herein, the number of LEDs 13 located in the sub-pixel region P is not limited. For example, the sub-pixel region P may be provided with two LEDs 13 that emit light of a same color therein, or may be provided with only one LED 13 therein.

The following is described by taking an example in which the sub-pixel region P is provided with one LED 13 therein. As shown in FIGS. 4A, 5 and 6, the base 100 has two first through holes 106 in the sub-pixel region P, and two driving electrodes 101 are provided in the sub-pixel region P and are connected to the positive electrode and the negative electrode of the LED 13, respectively. Of, course, if the sub-pixel region P is provided with two LEDs 13 therein, there are four driving electrodes 101 in the sub-pixel region P, and two of the four driving electrodes 101 are connected to the positive electrode and the negative electrode of one of the two LEDs 13, respectively; and the other two driving electrodes 101 are connected to the positive electrode and the negative electrode of the other LED 13, respectively.

In some embodiments, as shown in FIG. 6, the two driving electrodes 10 in the sub-pixel region P are disposed in a same layer, and may have the same structure.

In this case, referring to FIG. 6, the driving backplane 10 further includes an insulating layer 109 disposed on the surface, at the first side S1, of the base 100. The insulating layer 109 includes a plurality of via holes 1090 penetrating the insulating layer 109 in the sub-pixel region P. In the sub-pixel region P, each driving electrode 101 may be disposed in a corresponding via hole 1090.

In some examples, as shown in FIG. 6, the driving backplane further includes a plurality of conductive adhesive patterns 104 in the sub-pixel region P. The conductive adhesive pattern 104 is disposed in the via hole 1090, and is in direct contact with a surface of the driving electrode 101 facing away from the base 100. In this case, the positive electrode and the negative electrode of the LED 13 may be connected to respective driving electrodes 101 through respective conductive adhesive patterns 104 disposed in respective via holes 1090.

Herein, a material of the driving electrodes 101 and a material of the electroplating electrodes 103 are not limited, as long as the two materials are conductive materials. For example, the two materials may be a same conductive material, such as copper (Cu), or aluminum (Al).

In some other embodiments, referring to FIGS. 4A, 4b and 5, the plurality dr driving electrodes 101 include a first electrode 101A and a second electrode 101b that are disposed in different layers. Of course, the plurality of driving electrodes 101 may include more first electrodes 101A and more second electrodes 101b. For example, if there are four driving electrodes 101 in the sub-pixel region P, then the four driving electrodes 101 may include two first electrodes 101A and two second electrodes 101b that are disposed in different layers. One of the two first electrodes 101A and, a respective second electrode 101B are connected to the positive electrode and the negative electrode of one LED 13, respectively; and the other first electrode 101A and the other second electrode 101B are connected to the positive electrode and the negative electrode of the other LED respectively.

In a case where the first electrodes 101A and the second electrodes 101B are disposed in different layers, a parasitic capacitance between a first electrode 101A and a second electrode 101B that are adjacent may be reduced, and thus a parasitic capacitance formed between two adjacent driving electrodes 101 may be reduced, thereby facilitating the reduction of power consumption of the display panel 1.

Herein, the materials of the electroplating electrode 103, the first electrode 101A and the second electrode 101B are not limited, as long as the materials are conductive materials. In some examples, the material of the electroplating electrode 103, the material of the first electrode 101A, and the material of the second electrode 101B are the same. For example, the electroplating electrode 103, the first electrode 101A, and the second electrode 101B are made of a metal material, such as Cu.

It will be noted that, in the case where the driving electrodes 101 include the first electrode 101A and the second electrode 101b that are disposed in different layers, the positive electrode of the LED 13 in the display panel 1 is connected to one of the first electrode 101A and the second electrode 101B, and the negative electrode of the LED 13 is, connected to the other of the first electrode 101A and the second electrode 101B. For example, the positive electrode of the LED 13 is connected to the first electrode 101A, and the negative electrode of the LED 13 is connected to the second electrode 101B, Alternatively, the positive electrode of the LED 13 is connected to the second electrode 101B, and the negative electrode 101B is connected to the first electrode 101A.

On this basis, in some embodiments, as shown in FIGS. 4A, 4B and 5, the driving backplane 10 further includes a first insulating layer 107 disposed on the first side S1 of the base 100. The first insulating layer 107 includes a second through hole 1070 and a third through hole 1071 that are in the sub-pixel region P and penetrate the first insulating layer 107. Of course, the first insulating layer 107 may include a plurality of second through holes 1070 and a plurality of third through holes 1071 that are in the sub-pixel region P.

The first electrode 101A is disposed within the second through hole 1070, and is connected to a corresponding electroplating electrode 103. The second electrode 101B is connected to another corresponding electroplating electrode 103 through the third through hole 1071.

For example, as shown in FIG. 5, the first insulating layer 107 has a single-layer structure, and in a process of forming the driving electrodes 101, second through holes 1070 and third through holes 1071 are formed in the first insulating layer 107 firstly. Since the second through holes 1070 penetrate the first insulating layer 107, the second through holes 1070 may expose the electroplating electrodes 103 under the second through holes 1070. The first electrodes 101A are then formed in the second through holes 1070, respectively, so that the first electrodes 101A may be connected to the electroplating electrodes 103, respectively. Next, the second electrodes 101B are formed on the first insulating layer 107, which are connected to the electroplating electrodes 103 through the third through holes 1071, respectively, so that the first electrodes 101A and the second electrodes 101B may be disposed in different layers.

In some examples, a cross-section of the third through hole 1071 has a shape of an inverted trapezoid, and a portion of the second electrode 101 is filled within the third through hole 1071 and is connected to a corresponding electroplating electrode 103, so that the second electrode 101B is connected to the corresponding electroplating electrode 103.

Figure 7A:
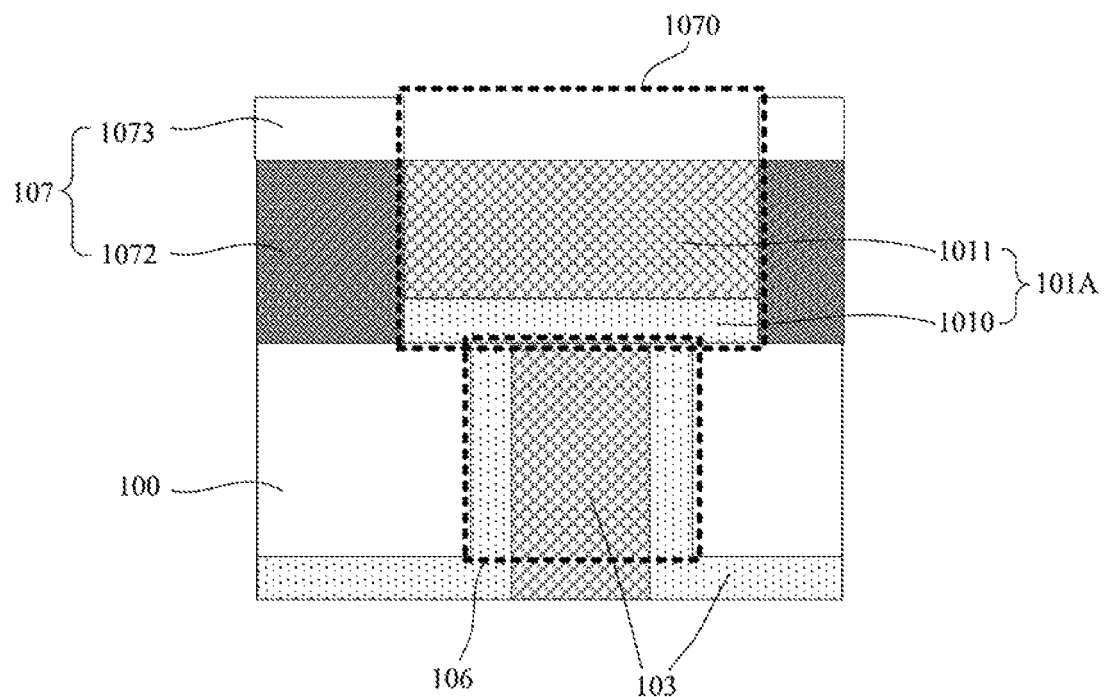
FIG. 7A is a schematic diagram of a first electrode of a driving backplane, in accordance with some embodiments of the present disclosure.

In some embodiments, as shown in FIG. 7A, the first electrode 101A includes a first sub-electrode 1010 and a second sub-electrode 1011 that are sequentially arranged in a direction away from the base 100. The first sub-electrode 1010 is connected to a corresponding electroplating electrode 103, and the first sub-electrode 1010 covers a corresponding, first through hole 106 in the base 100. That is, an orthographic projection of a respective first through hole 106 on a plane where a surface, at the first side S1, of the base 100 is located is within an orthographic projection of the first sub-electrode 1010 on the plane.

It will be noted that, in the process of forming the first electrode 101A by using the electroplating process, the first sub-electrode 1010 is used as a seed electrode of the first electrode 101A. For example, the first sub-electrode 1010 is first formed through the magnetron sputtering process, and then a voltage is applied to the first sub-electrode 1010, so that a material for forming the second sub-electrode 1011 grows on a surface of the first sub-electrode 1010 exposed to an electroplating solution, thereby forming the second sub-electrode 1011. The first sub-electrode 1010 and the second sub-electrode 1011 constitute the first electrode 101A.

It will be noted that, a thickness of the first sub-electrode 1010 may be smaller than a thickness of the second sub-electrode 1011. For example, the thickness of the first sub-electrode 1010 is approximately 800 nm, and the thickness of the second sub-electrode 1011 is approximately 10 µm.

In addition, the first sub-electrode 1010 and the second sub-electrode 1011 may be made of a same material or different materials. For example, at least one of the first sub-electrode 1010 and the second sub-electrode 1011 is made of Cu.

It will also be noted that, in a case where the first sub-electrode 1010 covers a first through hole 106 in the base 100, as shown in FIG. 4A, a size of a longitudinal section of the first sub-electrode 1010 is greater than a size of a longitudinal section of the first through hole 106, so that a size of a longitudinal section of the second sub-electrode 1011 formed by using the electroplating process may be greater than the size of the longitudinal section of the first through hole 106, thereby facilitating to improve a yield of an electrical connection between the driving electrode 101 and the LED 13 in the display panel 1. Herein, the longitudinal section refers to a section, parallel to the surface, at the first side S1, of the base 100.

Figure 7B:
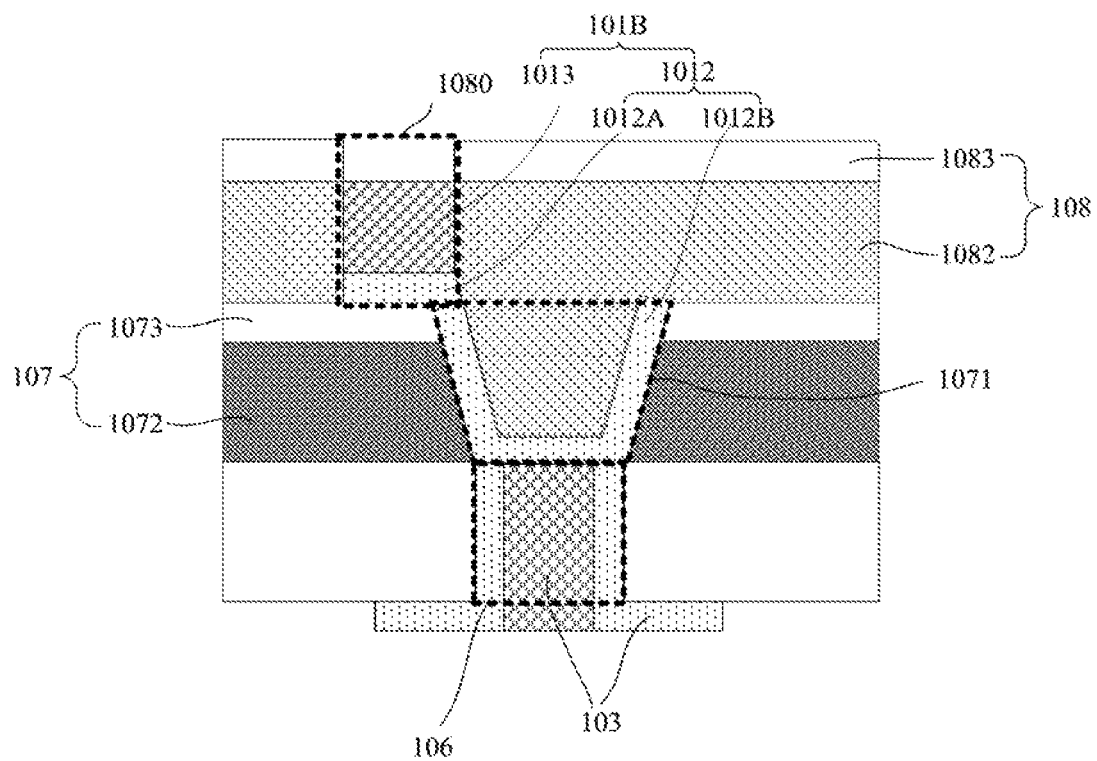
FIG. 7B is a schematic diagram of a second electrode of a driving backplane, in accordance with some embodiments of the present disclosure.

In some embodiments, as shown in FIG. 7B, the second electrode 101B includes a third sub-electrode 1012 and a fourth sub-electrode 1013 that are sequentially arranged in the direction away from the base 100. The third sub-electrode 1012 is connected to a corresponding electroplating electrode 103 through the third through hole 1071 in the first insulating layer 107.

For example, as shown in FIG. 7B, the third sub-electrode 1012 includes a first portion 1012A and a second portion 1012B that are directly connected. The first portion 1012A is located on a surface of the first insulating layer 107 facing away from the base 100, and is in direct contact with the fourth sub-electrode 1013. The second portion 1012B is located in the third through hole 1071 in the first insulating layer 107, and is in direct contact with the another corresponding electroplating electrode 103.

On this basis, in the process of forming the second electrode 101B by using the electroplating process, the third sub-electrode 1012 is used as a seed electrode of the second electrode 101B. For example, the third sub-electrode 1012 is first formed through the magnetron sputtering process, and then a voltage is applied to the third sub-electrode 1012, so that a material for forming the fourth sub-electrode 1013 grows on a surface of the third sub-electrode 1012 exposed to the electroplating solution, thereby forming the fourth sub-electrode 1013. The third sub-electrode 1012 and the fourth sub-electrode 1013 constitute the second electrode 1016.

It will be noted, only the first portion 1012A of the third sub-electrode 1012, i.e., the portion located on the surface of the first insulating layer 107 facing away from the base 100, is in direct contact with the fourth sub-electrode 1013. In this way, in the process of forming the second electrode 1016, only the first portion 1012A of the third sub-electrode 1012 is used as the seed electrode. That is, the fourth sub-electrode 1013 is formed only on a surface of the first portion 1012A of the third sub-electrode 1012. In this way, in a process of forming the fourth sub-electrode 1013, it is unnecessary to fill the third through hole 1071 with the material. Thereby, a thickness of the fourth sub-electrode 1013 may be small, and thus an amount of the material used for forming the fourth sub-electrode 1013 may be reduced. Further, a manufacturing cost may be reduced, and a manufacturing efficiency may be improved.

It will be noted that, the thickness of the third sub-electrode 1012 may be smaller than a thickness of the fourth sub-electrode 1013. For example, the thickness of the third sub-electrode 1012 is approximately 800 nm, and the thickness of the fourth sub-electrode 1013 is approximately 10 µm.

In some embodiments, as shown in FIGS. 4A, 7A and 7B, the first insulating layer 107 includes a first insulating sub-layer 1072 and a second insulating sub-layer 1073 that are sequentially arranged in the direction away from the base 100. In the direction away from the base 100, a surface of the first electrode 101A facing away from the base 100 is lower than a surface of the second insulating sub-layer 1073 facing away from the base 100, and the first portion 1012A of the third sub-electrode 1012 is disposed on the surface of the second insulating sub-layer 1073 facing away from the base 100.

In a case where Cu is selected as the material for forming the second sub-electrode 1011 since it is difficult to etch Cu, the efficiency of forming the second sub-electrode 1011 is pretty low Based on the embodiments described as above, the first insulating sub-layer 1072 may define a size and a shape of the second sub-electrode 1011, which may reduce the difficulty of the etching process used in the process of forming the second sub-electrode 1011, thereby improving the formation efficiency of the second sub-electrode 1011.

In addition, after the first electrode 101A is formed, in the process of forming the second electrode 1018 on a side of the first electrode 101A away from the base 100 by using the electroplating process, the second insulating sub-layer 1073 may protect the first electrode 101A, especially the second sub-electrode 1011 thereof. For example, the second insulating sub-layer 1073 may isolate water vapor and oxygen, and prevent the water vapor and the oxygen from corroding the first electrode 101A, Moreover, in the case where the first, electrode 101A and the second electrode 101B are disposed in different layers, the second insulating sub-layer 1073 may make the first electrode 101A and the second electrode 101B insulated from each other.

Herein, a thickness of the first insulating sub-layer 1072 may be greater than a thickness of the second insulating sub-layer 1073, but materials of the first insulating sub-layer 1072 and the second insulating sub-layer 1073 are not limited.

For example, the first insulating sub-layer 1072 is made of a material including at least one of photoresist, polyimide and resin, and the thickness of the first insulating sub-layer 1072 ranges, for example, from approximately 2 µm to approximately 20 µm, such as 2 µm, 4 µm, 8 µm, 10 µm, 14 µm, 16 µm, or 20 µm.

In some examples, the second insulating sub-layer 1073 is made of an inorganic substance, such as silicon nitride (SiNx), silicon oxide (SiO2) or silicon oxynitride (SiON). In this case, the thickness of the second insulating sub-layer 1073 ranges, for example, from approximately 300 nm to approximately 600 nm, such as 300 nm, 350 nm, 400 nm, 450 nm, 500 nm, 550 nm, or 600 nm. In some other examples, the second insulating sub-layer 1073 may also be made of an organic substance, such as a photosensitive resin. In this case, the thickness of the second insulating sub-layer 1073 ranges, for example, from approximately 1500 nm to approximately 5000 nm, such as 1500 nm, 2000 nm, 2500 nm 3000 nm, 3500 nm, 4000 nm, 4500 nm, or, 5000 nm.

Figure 8:
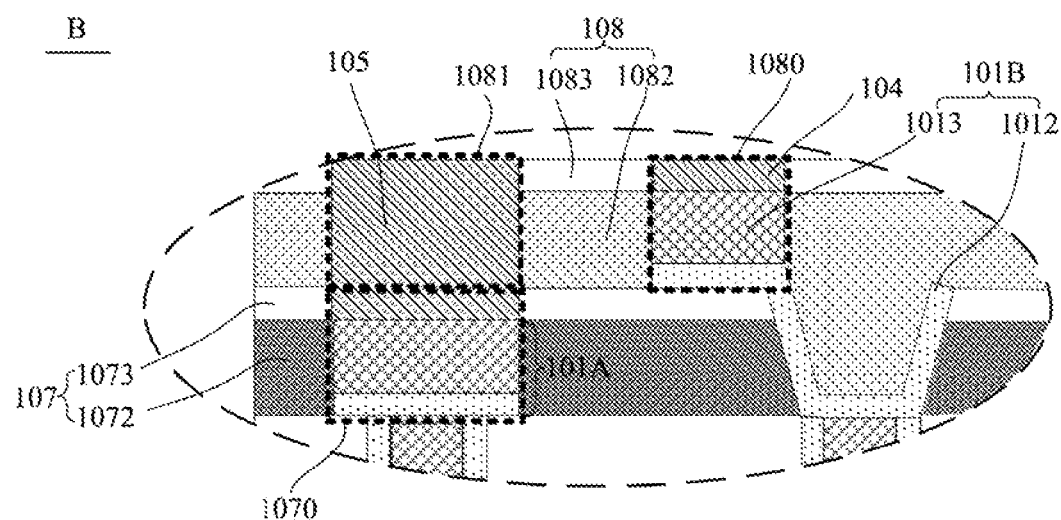
FIG. 8 is an enlarged view of the region B in FIG. 4A.

In some embodiments, as shown in FIGS. 7B and 8, the driving backplane 10 further includes a second insulating layer 108 disposed on a side of the first insulating layer 187 away from the base 100. The second insulating layer 108 includes at least one fourth through hole 1080 that is in the sub-pixel region P and penetrates the second insulating layer 108. A portion of the second electrode 1018 is disposed within a fourth through hole 1080, and the other portion of the second electrode 1016 is disposed in a third through hole 1071 in the first insulating layer 107. For example, the fourth sub-electrode 1013 and the first portion 1012A of the third sub-electrode 1012 are disposed within the fourth through hole 1080, and the second portion 1012B of the third sub-electrode 1012 is disposed in the third through hole 1071.

In some examples, referring to FIGS. 4A and 8, the second insulating layer 108 includes a third insulating sub-layer 1082 and a fourth insulating sub-layer 1083 that are sequentially disposed in the direction away from the base 100. In the direction away from the base 100, a surface of the portion of the second electrode 101B disposed in the fourth through hole 1080 facing away from the base 100 is lower than a surface of the fourth insulating sub-layer 1083 facing away from the base 100.

In some embodiments, in a case where the second electrode 101B includes the third sub-electrode 1012 and the fourth sub-electrode 1013, a surface, facing away from the base 100, of the portion of the second electrode 1016 disposed in the fourth through hole 1080 is also a surface of the fourth sub-electrode 1013 facing away from the base 100. In this case, the surface of the fourth sub-electrode 1013 facing away from the base 100 is lower than the surface of the fourth insulating sub-layer 1083 facing away from the base 100. That is to say, in a thickness direction of the base 100, the distance from the surface of the fourth sub-electrode 1013 facing away from the base 100 to the surface of the base 100 facing the fourth sub-electrode 1013 is smaller than the distance from the surface of the fourth insulating sub-layer 1083 facing away from the base 100 to the surface of the base 100 facing the fourth sub-electrode 1013.

In some embodiments, the surface of the fourth sub-electrode 1013 facing away from the base 100 is in a same plane as a surface of the third insulating sub-layer 1082 facing away from the base 100.

Herein, the fourth insulating sub-layer 1083 has a function similar to the second insulating sub-layer 1073, that is, the fourth insulating sub-layer 1083 may protect the second electrode 1018. The third insulating sub-layer 1082 is used to define a size and a shape of the fourth sub-electrode 1013.

In some examples, a thickness of the third insulating sub-layer 1082 may be greater than a thickness of the fourth insulating sub-layer 1083, but materials of the third insulating sub-layer 1082 and the fourth insulating sub-layer 1083 are not limited.

For example, the third insulating sub-layer 1082 is made of the photoresist, the polyimide or the resin, and the thickness of the third insulating sub-layer 1082 ranges from approximately 2 µm to approximately 20 µm, such as 2 µm, 4 µm, 8 µm, 10 µm, 14 µm, 16 µm, or 20 µm.

In some embodiments, the third insulating sub-layer 1082 and the first insulating sub-layer 1072 may be made of a same material, which may reduce the cost.

For example, the fourth insulating sub-layer 1083 is made of an inorganic substance, such as SiNx, SiO2 or SiON. The thickness of the fourth insulating sub-layer 1083 ranges, for example, from approximately 300 nm to approximately 600 nm, such as 300 nm, 350 nm, 400 nm, 450 nm, 500 nm, 550 nm, or 600 nm. In another example, the fourth insulating sub-layer 1083 may also be made of an organic substance, such as the photosensitive resin. The thickness of the fourth insulating sub-layer 1083 ranges, for example, from approximately 1500 nm to approximately 5000 nm, such as 1500 nm, 2000 nm, 2500 nm, 3000 nm, 3500 nm, 4000 nm, 4500 nm, or 5000 nm.

In some embodiments, the fourth insulating sub-layer 1083 and the second insulating sub-layer 1073 are made of a same material, which may reduce the cost.

In some embodiments, referring to FIGS. 4A and 8, the second insulating layer 108 further includes at least one fifth through hole 1081 that is in the sub-pixel region P and penetrates the second insulating layer 108. The fifth through hole 1081 is connected to a corresponding second through hole 1070, and exposes a corresponding first electrode 101 (i.e., the first electrode 101A disposed in the corresponding second through hole 1070).

Additionally, in some embodiments, as shown in FIGS. 4A and 8, the driving backplane 10 further includes at least one first conductive adhesive pattern 104 and at least one second conductive adhesive pattern 105 that are in the sub-pixel region P. The first conductive adhesive pattern 104 is disposed in a corresponding fourth through hole 1080, and is in direct contact with a surface of a corresponding second electrode 101B facing away from the base 100, The second conductive adhesive pattern 105 is disposed in a corresponding fifth through hole 1081, and is in direct contact with a surface of a corresponding first electrode 101A (i.e., the first, electrode 101A disposed in the corresponding second through hole 1070) facing away from the base 100.

In some examples, as shown in FIGS. 4A and 8, in a case where the second insulating layer 108 includes the third insulating sub-layer 1082 and the fourth insulating sub-layer 1083, surfaces of the first conductive adhesive patterns 104 facing away from the base 100 and surfaces of the second conductive adhesive patterns 105 facing away from the base 100 are in the same plane as the surface of the fourth insulating sub-layer 1083 away from the base 100.

In this case, a thickness of the first conductive adhesive pattern 104 may be less than a thickness of the second conductive adhesive pattern 105. In this way, the first conductive adhesive patterns 104 and the second conductive adhesive patterns 105 may not only act as conductors, but also may increase flatness of a surface of the driving backplane 10, which may further make it easy to mount the LEDs 13 on an upper surface of the driving backplane 10 in a subsequent manufacturing process.

Figure 9:
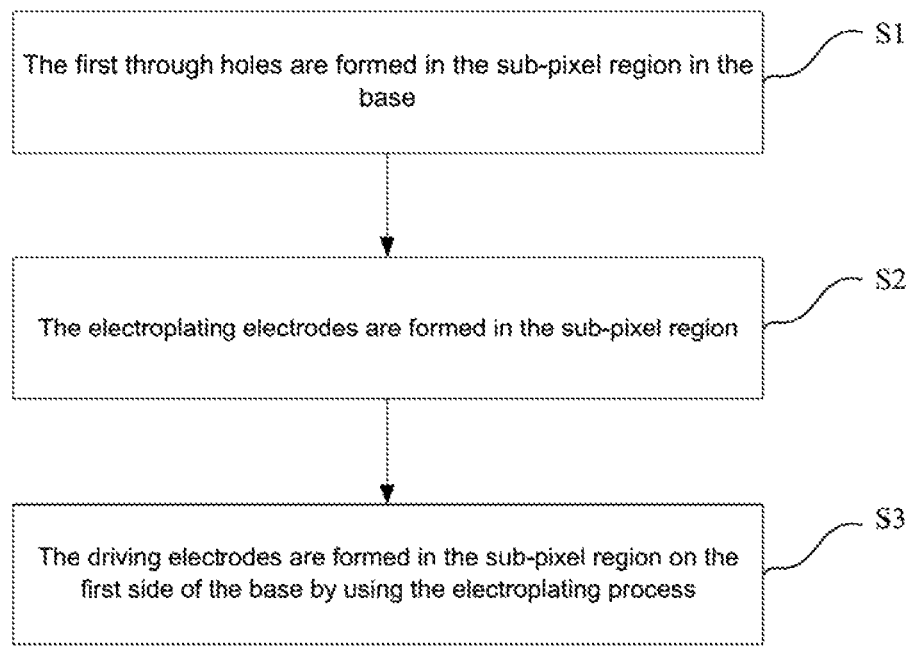
FIG. 9 is a flow diagram of a method for manufacturing a driving backplane, in accordance with some embodiments of the present disclosure.

Some embodiments of the present disclosure provide a method for manufacturing the driving backplane 10 (shown in FIGS. 4A, 5 and 6) described in any one of the above embodiments. As shown in FIG. 9, the method includes S1 to S3.

Figure 10A:
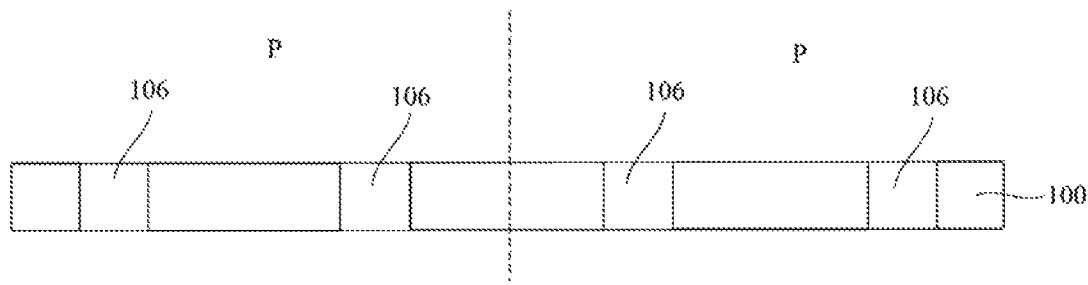
FIGS. 10A and 10B are schematic diagrams showing steps of forming electroplating electrodes in a method for manufacturing a driving backplane, in accordance with some embodiments of the present disclosure.

Referring to FIG. 10A, in S1, the first through holes 106 are formed in the sub-pixel region P in the base 100. For example, the diameter of the first through hole 106 is approximately 500 μm.

It will be noted that for the sake of clarity, only processes of forming structures in a sub-pixel region P are described, but when a structure is formed in a sub-pixel region P, the same structure may be formed in other sub-pixel regions P simultaneously. For example, when the first through holes 106 are formed in the sub-pixel region P in the base 100, other first through holes 106 are formed in other sub-pixel region P in the base 100 simultaneously.

Figure 10B:
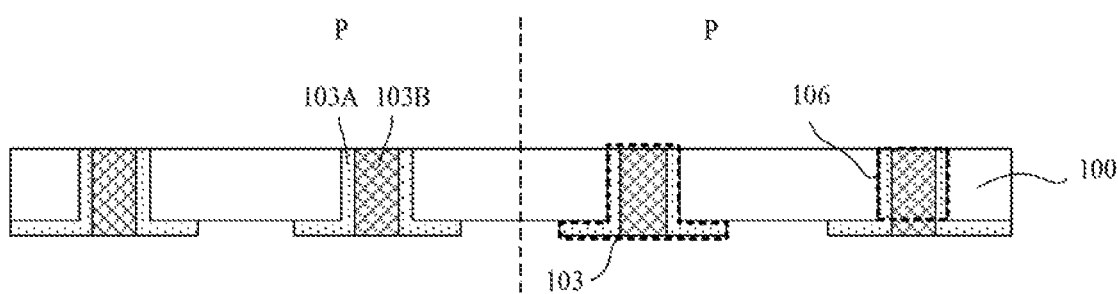

Referring to FIG. 10B, in S2, the electroplating electrodes 103 are formed in the sub-pixel region P. At least a portion of each electroplating electrode 103 is formed in a corresponding first through hole 106.

Figure 11A:
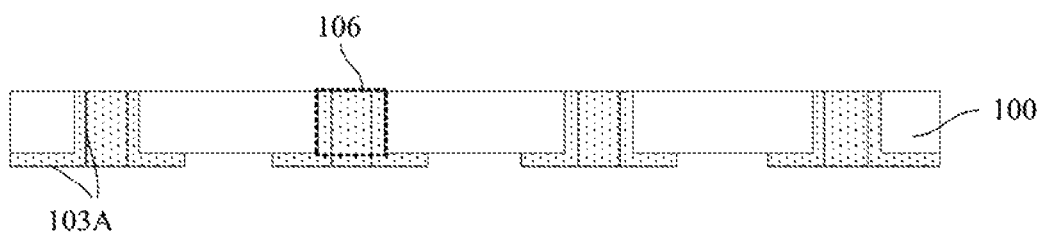
FIGS. 11A and 11B are schematic diagrams showing steps of forming electroplating electrodes in a method for manufacturing another driving backplane, in accordance with some embodiments of the present disclosure.
Figure 11B:
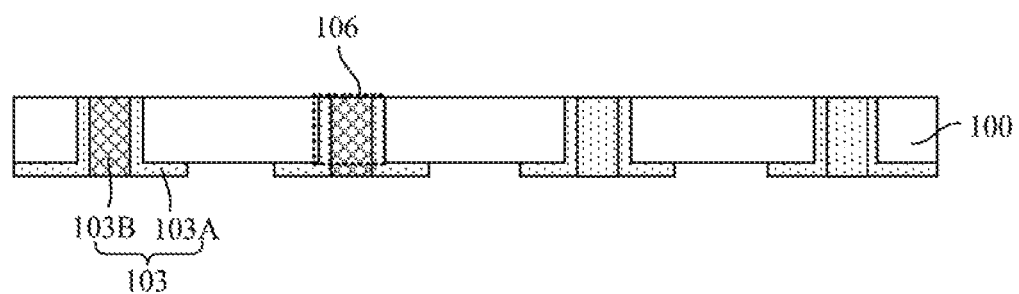

For example, referring to FIGS. 11A and 11B, the step of forming the electroplating electrodes 103 in S2 includes S21 and S22.

In S21, by using a first magnetron sputtering process, electroplating electrode seed layers 103A are each formed both on an inner wall of a corresponding first through hole 106 and in a region surrounding the corresponding first through hole 106 on the surface, at the second side S2, of the base 100.

In S22, electroplating deposition portions 103B are each formed in a corresponding first through hole 106, by using a first electroplating process through the electroplating electrode seed layers 103A.

In the first electroplating process, for example, the electroplating electrode seed layers 103A are immersed in an electroplating solution, and then voltages are applied to the electroplating electrode seed layers 103A, so that an electroplating material may be deposited on surfaces of the electroplating electrode seed layers 103A to form electroplating deposition portions 1036. The electroplating electrode seed layer 103A and the electroplating deposition portion 1036 constitute the electroplating electrode 103. In some examples, the material of the electroplating electrodes 103 is Cu. In this case, the electroplating solution may be an electrolyte containing copper ions.

In the process of forming the electroplating electrodes 103 through the above two, steps, i.e., S21 and S22, the electroplating electrode seed layers 103A are connected to an external power supply, and serve as seed layers (i.e., seed layers for electrochemical deposition) used for making the electroplating material grow so as to form the electroplating deposition portions 1036. In this way, a manufacturing process of the electroplating electrodes 103 may be simplified.

It will be noted that, the electroplating electrode seed layer 103A includes the portion formed on the inner wall of the first through hole 106 and the portion formed on the surface, at the second side S2, of the base 100. In this case, a cross-section of the electroplating electrode 103 has an Inverted r shape. In other words, an area of an orthographic projection of the portion of the electroplating electrode 103 disposed on the surface, at the second side S2, of the base 100 on the plane where the surface of the base 100 is greater than an area of an orthographic projection of the portion of the electroplating electrode 103 disposed within the first through hole 106 on the plane. In this way, it is easy to connect the electroplating electrodes 103 to the external power supply. However, it will be noted that a structure of the electroplating electrode 103 is not limited thereto. For example, the cross-section of the electroplating electrode 103 may also have a rectangular shape.

It will also be noted that, in the process of forming the electroplating electrode seed layers 103A through the first magnetron sputtering process, the first sub-electrode 1010 of the first electrode 101A (referring to FIG. 7A) may be formed through the same first magnetron sputtering process in a region surrounding a corresponding first through hole 106 on the surface, at the first side S1, of the base 100, which may simplify the process of manufacturing the driving backplane 10.

In this case, a thickness of an electroplating film layer formed on the surface, at the first side S1, of the base 100 through the first magnetron sputtering process may be large. To solve, this problem, a wet etching process or a chemical mechanical grinding process may be used to reduce the thickness of the electroplating film layer, and a photo-etching process is used to etch the electroplating film layer to obtain the first sub-electrode 1010 with a small thickness. For example, a thickness of the first sub-electrode 1010 ranges from approximately 300 nm, to approximately 600 nm, such as 300 nm, 350 nm, 400 nm, 450 nm, 500 nm, 550 nm, or 600 nm.

In S3, referring to FIG. 4A, 5 or 6, based on the electroplating electrodes 103, driving electrodes 101 are formed in the sub-pixel region P on the first side S1 of the base 100 by using an electroplating process.

Figure 12:
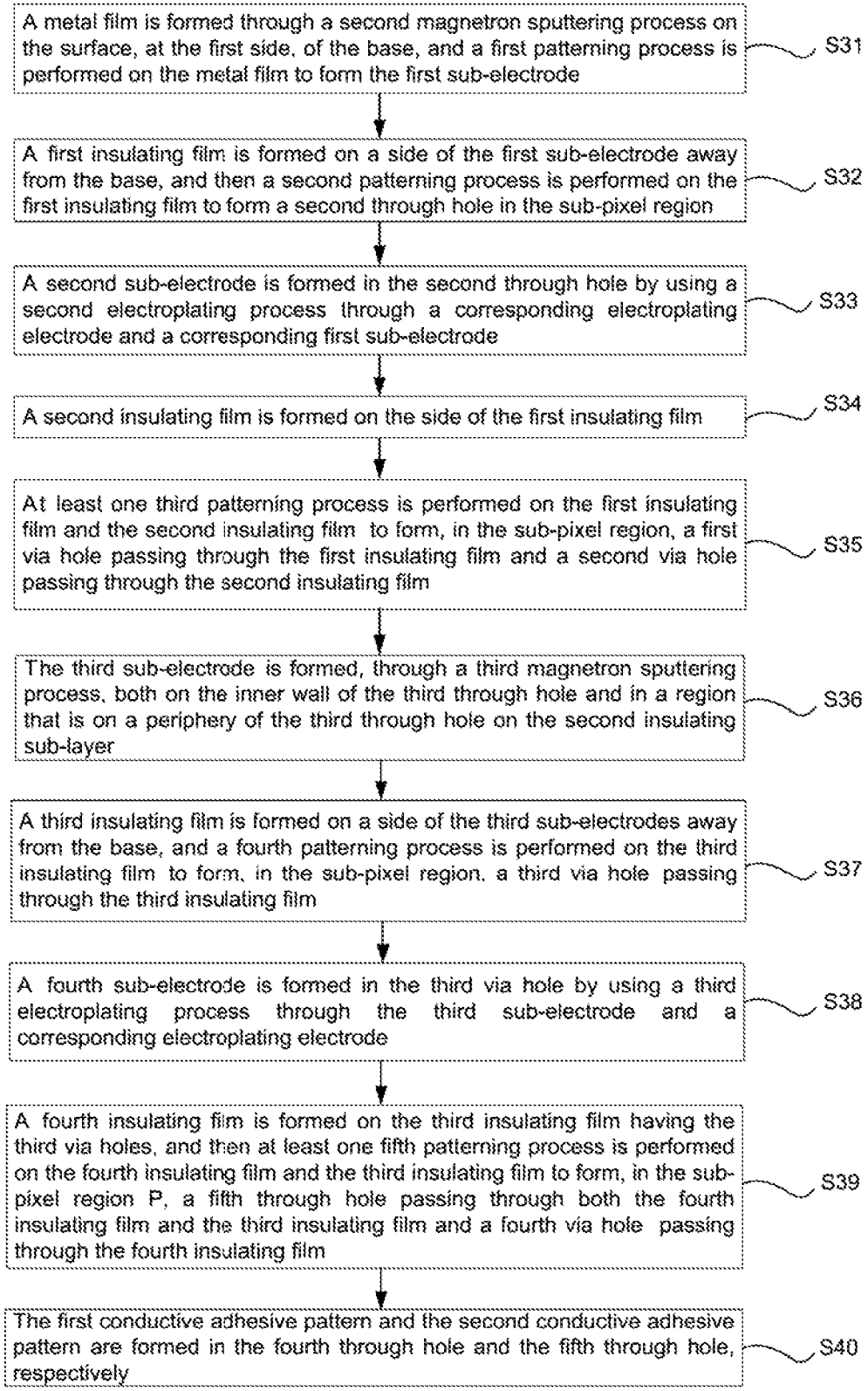
FIG. 12 is a flow diagram of a method for manufacturing another driving backplane, in accordance with some embodiments of the present disclosure.

In some embodiments, the driving backplane 10 to be manufactured may have a structure shown in FIG. 4A or 5. That is, the driving electrodes 101 include the first electrode 101A and the second electrode 101B that are disposed in different layers. In this case, the step of forming the driving electrodes 01 in S3 includes a step of forming the first electrode 101A. Referring to FIG. 12, the step of forming the first electrode 101A, includes S31 to S33.

Figure 13:
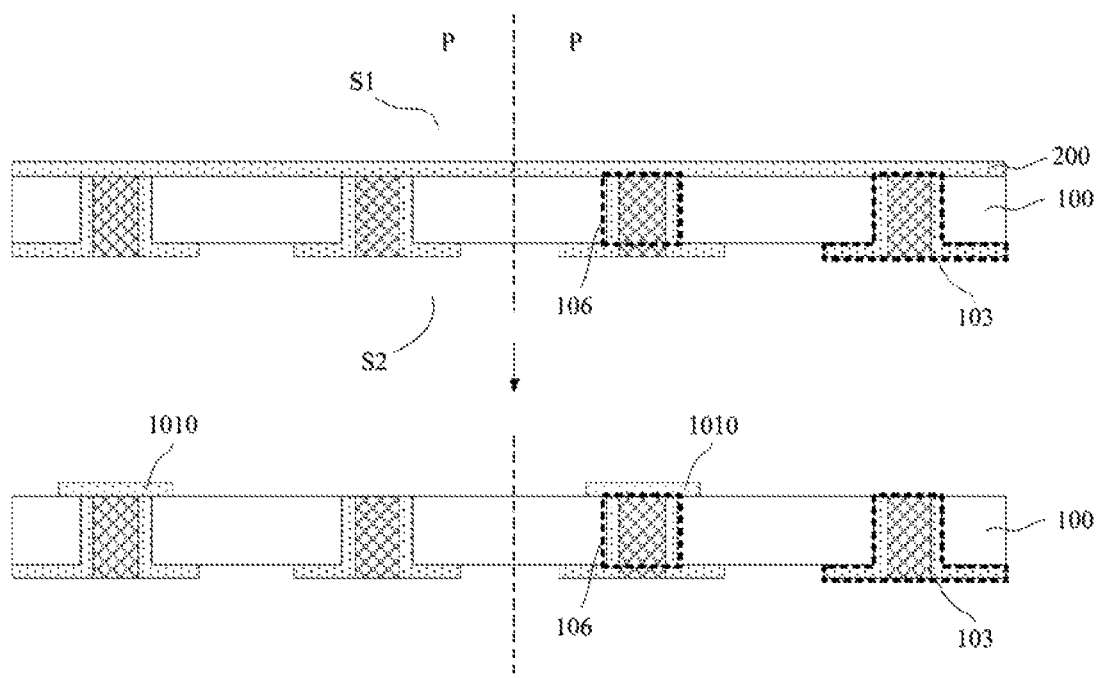
FIGS. 13 to 20 are schematic diagrams showing steps of forming driving electrodes in a method for manufacturing a driving backplane, in accordance with some embodiments of the present disclosure.

Referring to FIG. 13, in S31, a metal film 200 is formed through a second magnetron sputtering process on the surface, at the first side S1, of the base 100, and a first patterning process is performed on the metal film 200 to form the first sub-electrode 1010. An orthographic projection of the first through hole 106 on the plane where the surface of the base 100 is located is within an orthographic projection of the first sub-electrode 1010 on the plane.

Figure 14:
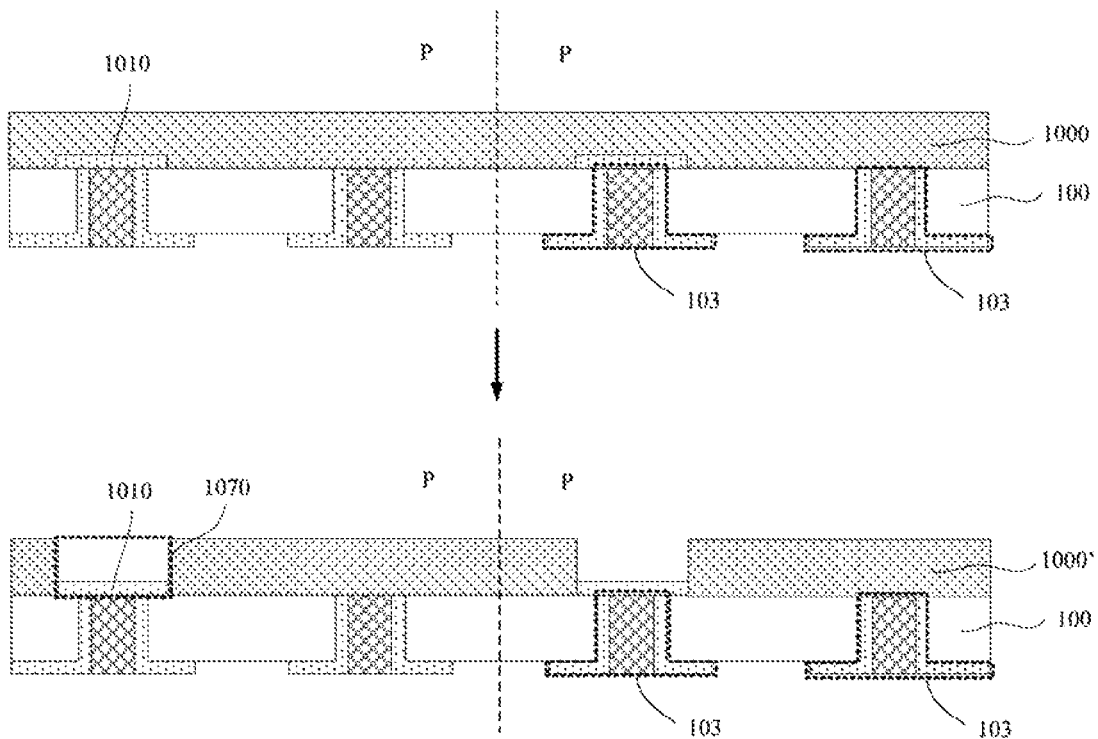

Referring to FIG. 14, in S32, a first insulating film 1000 is formed on a side of the first sub-electrode 1010 away from the base 100, and then a second patterning process is performed on the first insulating film 1000 to form a second through hole 1070 in the sub-pixel region, to obtain a first insulating film 1000' having the second through hole 1070. The second through holes 1070 are in one-to-one correspondence with the first sub-electrodes 1010, and the second through holes 1070 expose corresponding first sub-electrodes 1010. Herein, the first insulating film 1000' is used to form the first insulating sub-layer 1072. Hereinafter, insulating films obtained before the formation of the first insulating sub-layer 1072 are all called first insulating films, but different reference signs are used to indicate the first insulating films in different states.

Figure 15:
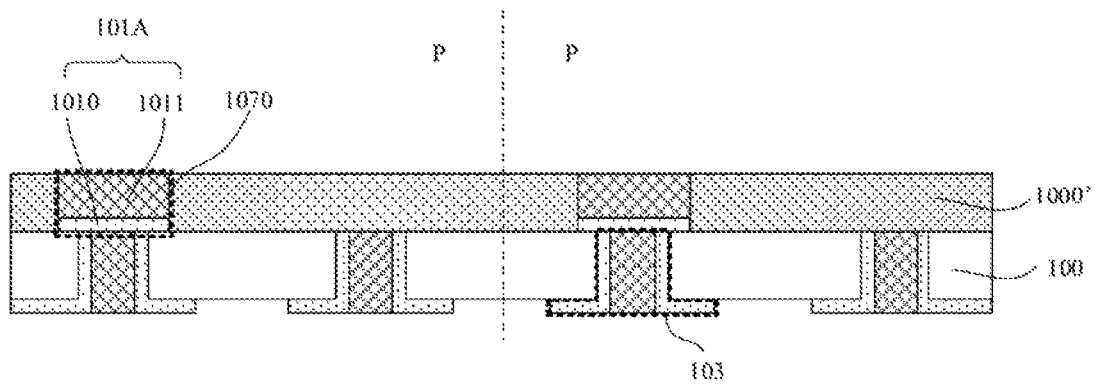

Referring to FIG. 15, in S33, a second sub-electrode 1011 is formed in the second through hole 1070 by using a second electroplating process through a corresponding electroplating electrode 103 and a corresponding first sub-electrode 1010. The first sub-electrode 1010 and the second sub-electrode 1011 constitute the first electrode 101A.

It will be noted that, since the second sub-electrode 1011 is formed by using the second electroplating process through a corresponding electroplating electrode 103 and a corresponding first sub-electrode 1010, the second sub-electrode 1011 is electrically connected to the corresponding first sub-electrode 1010 and the corresponding electroplating electrode 103, That is to say, the first electrode 101A is electrically connected to the corresponding electroplating electrode 103.

In some embodiments, as shown in FIG. 15, when the second sub-elect des 1011 are formed by using the second electroplating process, in a case where surfaces of the second sub-electrodes 1011 facing away from the base 100 higher than a surface of the first insulating film 1000 facing away from the base 100, in order to ensure subsequent manufacturing processes to be performed successfully, the portion of the second sub-electrodes 1011 higher than the first insulating film 1000 may be removed by using the wet etching process or the mechanical grinding process, so that the surfaces of the second sub-electrodes 1011 facing away from the base 100 are in the same plane as the surface of the first insulating film 1000' facing away from the base 100.

Furthermore, the step of forming the driving electrodes 101 in S3 further includes a step of forming the second electrode 1018. As mentioned above, the driving backplane 10 to be manufactured may have two different structures respectively shown in FIGS. 4A and 5. The step of forming the second electrode 1018 shown in FIG. 4A and the step of forming the second electrode 1018 shown in FIG. 5 are different, which will be described below as examples.

In the case where the driving backplane 10 has a structure shown in FIG. 4A, as shown in FIG. 12, the step of forming the second electrode 1018 includes S34 to S38.

Figure 16:
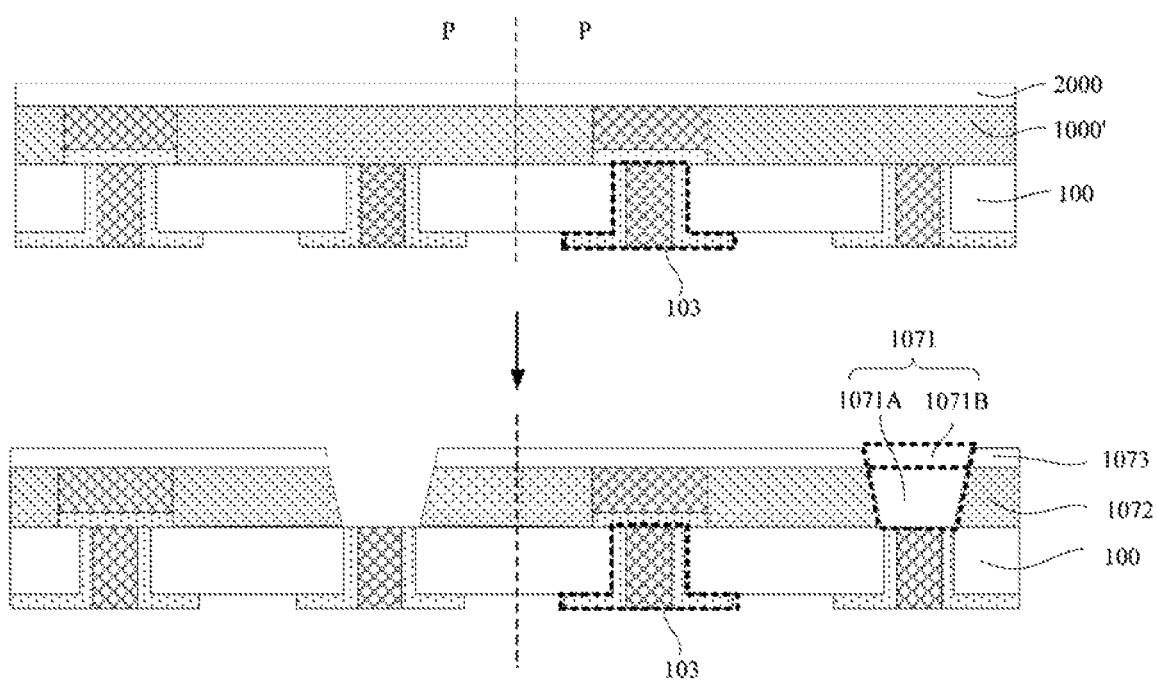

Referring to FIG. 16, in S34, a second insulating film 2000 is formed on the first insulating film 1000' (formed in S32).

With continued reference to FIG. 16, in S35, at least one third patterning process is performed on the first insulating film 1000' and the second insulating film 2000 to form, in the sub-pixel region, a first via hole 1071A passing through the first insulating film 1000' and a second via hole 10718 passing through the second insulating film 2000. The first via hole 1071A is formed at a position of the first insulating film 1000 where the second electrode 101B is to be formed and exposes a corresponding electroplating electrode 103. The second via hole 1071B is connected to the first via hole 1071A. Herein, the second via hole 1071B and the first via hole 1071A constitute a third through hole 1071. The first insulating film 1000' having the first via holes 1071A is the first insulating sub-layer 1072, and the second insulating film 2000 having the second via holes 10718 is the second insulating sub-layer 1073.

It will be noted that, in a case where a material of the first insulating film 1000k is the same as that of the second insulating film 2000, the first via holes 1071A and the second via holes 1071B may be formed through the same patterning process, which may simplify the manufacturing process. Of course, the first via holes 1071A and the second via holes 1071 may also be formed through different patterning processes, which is not limited herein.

Figure 17:
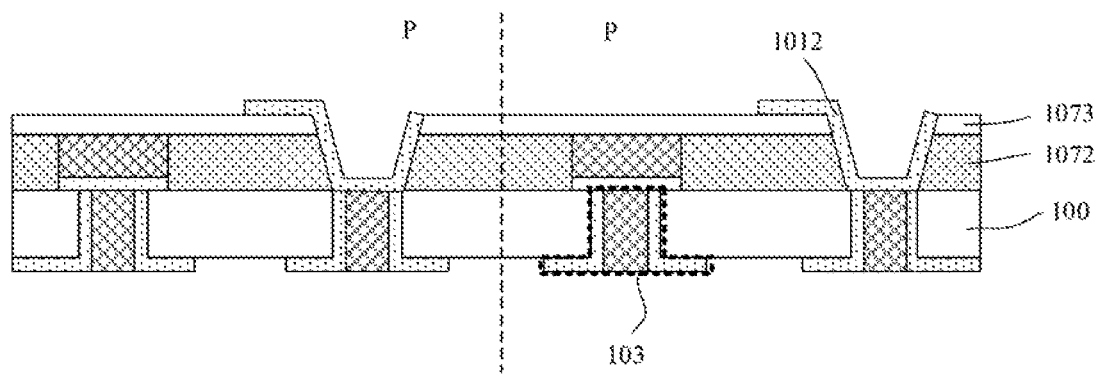

Referring to FIG. 17, in S36, the third sub-electrode 1012 is formed, through a third magnetron sputtering process, both on the inner wall of the third through hole 1071 and in a region that is on a periphery of the third through hole on the second insulating sub-layer 1073.

In some examples, the third through hole 1071 formed in the S35 may have a cross-section in a shape of an inverted trapezoid. In this way, a corner of the third sub-electrode 1012 formed by a bottom and a sidewall of the third through hole 1071 has a small bending degree, which may reduce the risk of the third sub-electrode 1012 fracturing at the corner, and thus ensure the quality of the driving backplane 10.

Figure 18:
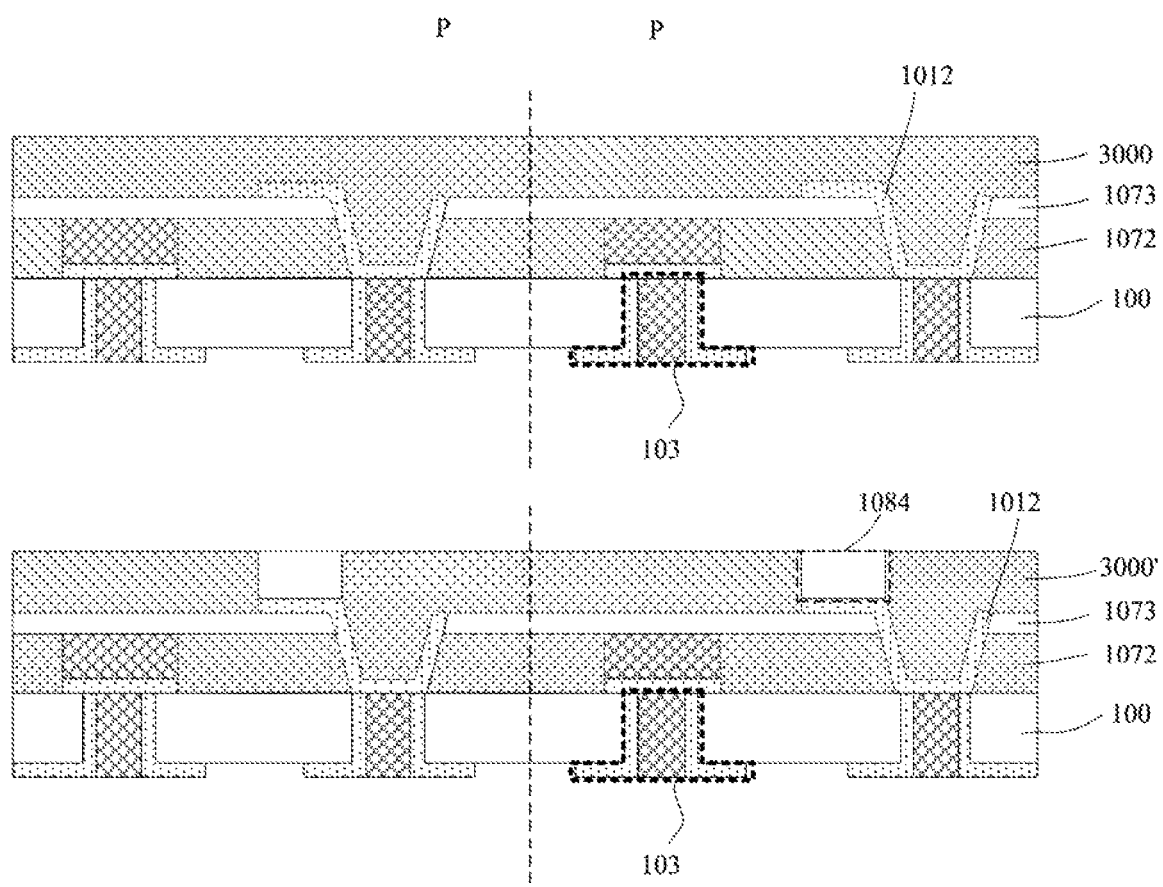

Referring to FIG. 18, in S37, a third insulating film 3000 is formed on a side of the third sub-electrodes 1012 away from the base 100, and a fourth patterning process is performed on the third insulating film 3000 to form, in the sub-pixel region P, a third via hole 1084 passing through the third insulating film 3000. Each of the fourth openings 1084 is formed in a portion of the third insulating film 3000 corresponding to a first portion 1012A of a corresponding third sub-electrode 1012, so as to expose the first portion 1012A of the third sub-electrode 1012, and a third insulating film 3000 having the third via holes 1084 is obtained.

Figure 19:
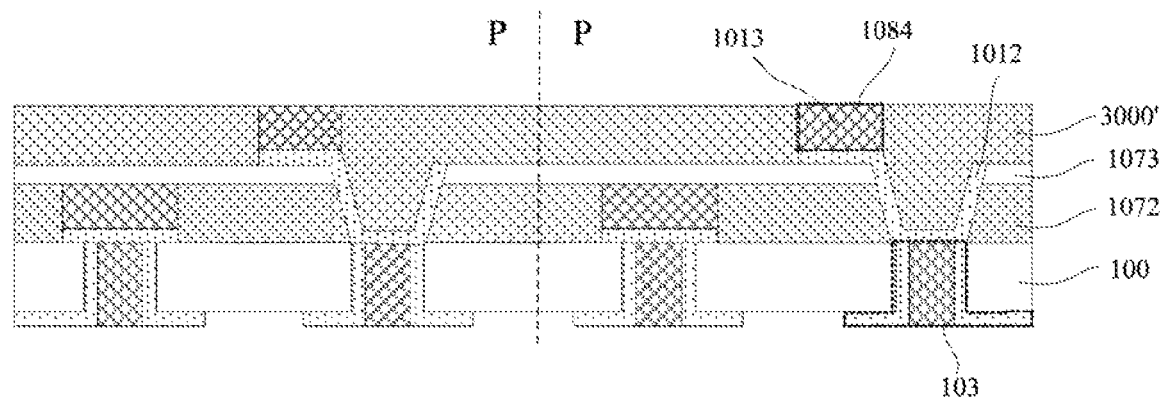

Referring to FIG. 19, in S38, a fourth sub-electrode 1013 is formed in the third via hole 1084 by using a third electroplating process through the third sub electrode 1012 and a corresponding electroplating electrode 103. It will be noted that, each of the fourth sub-electrodes 1013 is formed in a corresponding third via hole 1084, and is in direct contact with a corresponding third sub-electrode 1012, and the fourth sub-electrode 1013 and the third sub-electrode 1012 constitute a second electrode 101B.

Figure 20:
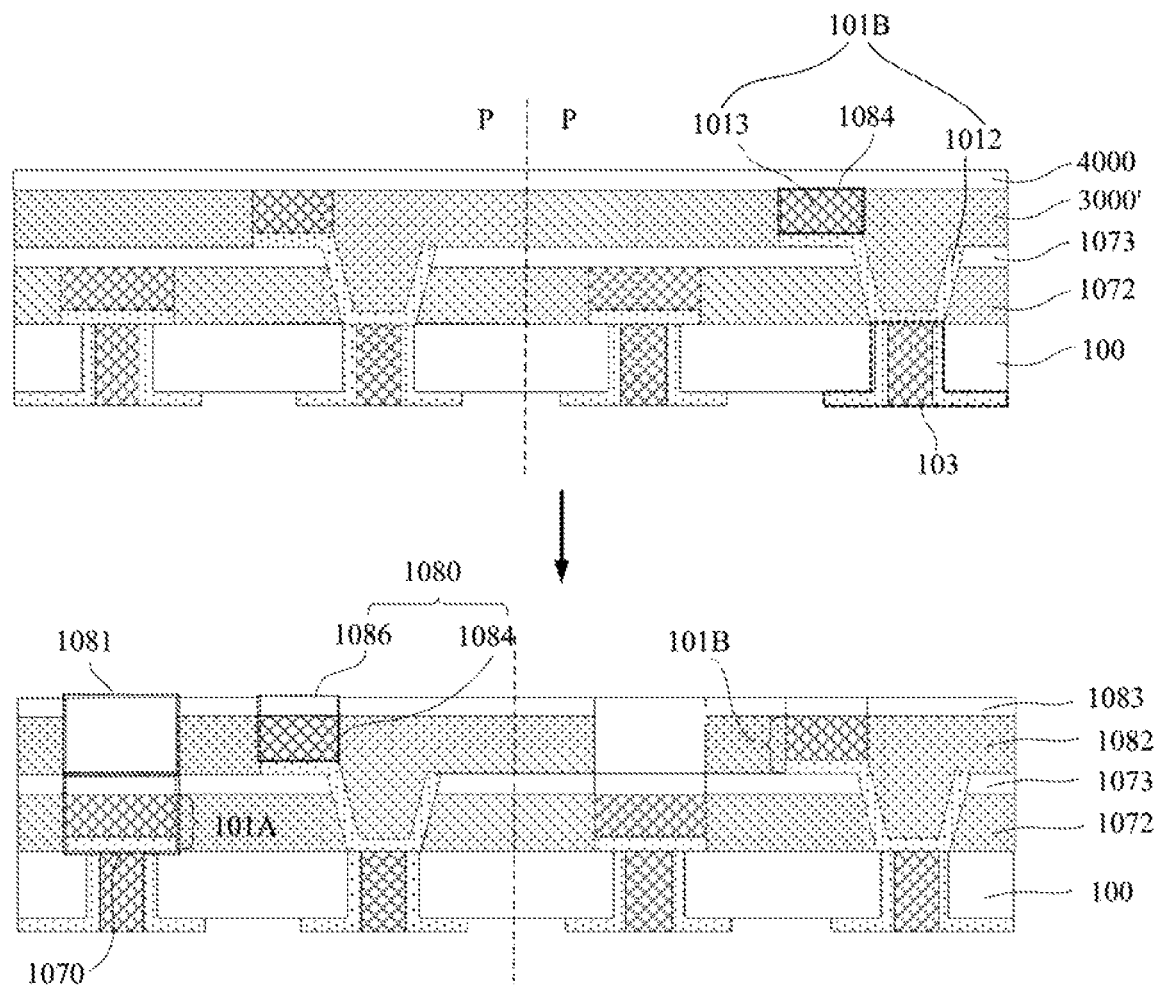

In some embodiments, referring to FIGS. 12 and 20, after the fourth sub-electrode 1013 is formed, the manufacturing method further includes S39 and S40.

In S39, as shown in FIG. 20, a fourth insulating film 4000 is formed on the third insulating film 3000' having the third via holes 1084, and then at least one fifth patterning process is performed on the fourth insulating film 4000 and the third insulating film 3000' to form, in the sub-pixel region P, a fifth through hole 1081 passing through both the fourth insulating film 4000 and the third insulating film 3000' and a fourth via hole 1086 passing through the fourth insulating film 4000.

Each of the fifth through holes 1081 is formed in portions, corresponding to a second through hole 1070, of the fourth insulating film 4000 and the third insulating film 3000 having the third via holes 1084, so as to expose the second sub-electrode 1011 of the first electrode 101A disposed in second through hole 1070. Each of the fourth via holes 1086 is formed in a portion of the fourth insulating film 4000 corresponding to a third via hole 1084, so as to expose the fourth sub-electrode 1013 of the second electrode 1016 disposed in third via hole 1084, and the fourth via hole 1088 is connected to the third via hole 1084. Herein, the fourth via hole 1086 and the third via hole 1084 constitute a fourth through hole 1080. In this way the third insulating sub-layer 1082 and the fourth insulating sub-layer 1083 are obtained.

In S40, referring to FIG. 4A, the first conductive adhesive pattern 104 and the second conductive adhesive pattern 105 are formed in the fourth through hole 1080 and the fifth through hole 1081, respectively.

Each of the first conductive adhesive patterns 104 is in direct contact with a fourth sub-electrode 1013 of a corresponding second electrode 1016. Each of the second conductive adhesive patterns 105 is in direct contact with a second sub-electrode 1011 of a corresponding first electrode 101A. Herein, the first conductive adhesive pattern 104 and the second conductive adhesive pattern 105 are used to mount the LED 13 and electrically connect the LED 13 to corresponding driving electrodes 101.

In some examples, the surfaces of the first conductive adhesive patterns 104 facing away from the base 100 and the surfaces of the second conductive adhesive patterns 105 facing away from the base 100 are in the same plane as the surface of the fourth insulating sub-layer 1083 facing away from the base 100. That is to say, the first conductive adhesive pattern 104 and the second conductive adhesive pattern 105 may be filled within the fifth through hole 1081 and the fourth through hole 1081 which are used to expose the second sub-electrode 1011 and the fourth sub-electrode 1013, respectively, so that it is easy to mount the LED 13 on an upper surface of the driving backplane 10 through the first conductive adhesive pattern 104 and the second conductive adhesive pattern 105.

In some other embodiments, the driving backplane 10 has the structure shown in FIG. 5. In this case, the difference between the process of forming the second electrode 101B shown in FIG. 5 and the process shown in FIG. 4A is that, as shown in FIG. 12, after the first insulating film 1000' having the second through holes 1070 is formed, it is unnecessary to form the second insulating film 2000 on the first insulating film 1000' and to pattern the second insulating film 2000. In this case, the third through hole 1071 is composed of only the first via hole 1071A. In addition, as for steps of forming the second electrode 101B, reference may be made to S34 to S38, which will not be repeated herein.

In addition, except the structures shown in FIGS. 4A and 5, the driving backplane 10 has another structure shown in FIG. 6, In this case, the driving electrodes 101 in the sub-pixel region P have the same structure, which is similar to that of the first electrodes 101A shown in FIG. 4A. Therefore, the process of forming the driving electrodes 101 shown in the FIG. 6 may be referred to the process of forming the first electrodes 101A, i.e., S31 to S34, which will not be repeated herein.

In the manufacturing method described as above, the first through holes 106 are first formed in the base 100, and then the electroplating electrodes 103 are formed in the first through holes 106, the driving electrodes 101 are then formed on the base 100 on which the electroplating electrodes 103 have been formed. In this way, the electroplating electrodes 103 and all the first electrodes 101A and the second electrodes 101B may be disposed at two different sides of the base 100. It is unnecessary to provide the electroplating region at the periphery of the display area of the driving backplane 10 and thus the effective area and the utilization rate of the base 100 may be increased, and furthermore the number of the wires on the surface, at the first side S1, of the driving backplane 10 may be reduced, which may increase the number of the sub-pixel regions P of the driving backplane 10. In addition, after the electroplating process is performed, it is unnecessary to cut and remove the electroplating electrodes, which may simplify the manufacturing process of the driving backplane 10, thereby reducing a defective rate of the products and improving the manufacturing efficiency of the driving backplane 10.

It will be noted that, in the process of manufacturing the driving backplane 10, each insulating film (e.g., each of the first insulating film to the fourth insulating film) may be formed by a film formation process, for example, a film formation by chemical vapor deposition, sputtering, or evaporation.

In addition, the insulating film (e.g., each of the first insulating film to the fourth insulating film) may be made of a material including at least one of the photoresist, the polyimide and the resin (such as the photosensitive resin), For example, in a case where the insulating film is made of the photoresist, the patterning process may include: after the photoresist is coated to form the insulating film, exposing and developing the coated photoresist so as to pattern the insulating, film. In another example, in a case where the insulating film is made of the polyimide, the patterning process includes: shielding the insulating film by a hard mask and then etching the insulating film; or, coating a photoresist on the insulating film, exposing and developing the photoresist, and then etching the insulating film. Herein, the hard mask may be made of SiO2.

The forgoing descriptions are merely specific implementation manners of the present disclosure, but the protection scope of the present disclosure is not limited thereto. Any, changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A driving backplane, comprising:
    a base, having first through holes in a sub-pixel region;
    electroplating electrodes disposed in the sub-pixel region, wherein at least a portion of each electroplating electrode is disposed within a respective one of the first through holes; and
    driving electrodes disposed in the sub-pixel region and on a first side of the base,
    wherein each driving electrode is connected to a respective one of the electroplating electrodes, and
    wherein the driving electrodes include a first electrode and a second electrode that are disposed in different layers.

2. The driving backplane according to claim 1, wherein the electroplating electrode includes a first electroplating sub-electrode disposed within the first through hole and a second electroplating sub-electrode disposed on a surface, at a second side opposite to the first side, of the base, and the first electroplating sub-electrode and the second electroplating sub-electrode are directly connected; and
    an orthographic projection of the first electroplating sub-electrode on a plane where the surface of the base is located is within an orthographic projection of the second electroplating sub-electrode on the plane.

3. The driving backplane according to claim 1, further comprising a first insulating layer disposed on the first side of the base, wherein the first insulating layer includes a second through hole and a third through hole that are in the sub-pixel region; and the first electrode is disposed within the second through hole and is connected to a corresponding electroplating electrode; and the second electrode is connected to another corresponding electroplating electrode through the third through hole.

4. The driving backplane according to claim 3, wherein the first electrode includes a first sub-electrode and a second sub-electrode that are sequentially arranged in a direction away from the base, and the first sub-electrode is connected to the corresponding electroplating electrode; and an orthographic projection of a respective first through hole on a plane where a surface, at the first side, of the base is located is within an orthographic projection of the first sub-electrode on the plane.

5. The driving backplane according to claim 3, wherein the second electrode includes a third sub-electrode and a fourth sub-electrode that are sequentially arranged in a direction away from the base; and the third sub-electrode is connected to the another corresponding electroplating electrode through the third through hole.

6. The driving backplane according to claim 5, wherein the third sub-electrode includes a first portion and a second portion that are directly connected; and the first portion is located on a surface of the first insulating layer facing away from the base, and the second portion is located in the third through hole; and the first portion of the third sub-electrode is in direct contact with the fourth sub-electrode, and the second portion of the third sub-electrode is in direct contact with the another corresponding electroplating electrode.

7. The driving backplane according to claim 6, wherein the first insulating layer includes a first insulating sub-layer and a second insulating sub-layer that are sequentially arranged in the direction away from the base; and in the direction away from the base, a surface of the first electrode facing away from the base is lower than a surface of the second insulating sub-layer facing away from the base; and the first portion of the third sub-electrode is disposed on the surface of the second insulating sub-layer facing away from the base.

8. The driving backplane according to claim 3, further comprising a second insulating layer disposed on a surface of the first insulating layer facing away from the base, and the second insulating layer includes a fourth through hole that is in the sub-pixel region; and a portion of the second electrode is disposed within the fourth through hole, and a remaining portion of the second electrode is disposed within the third through hole.

9. The driving backplane according to claim 8, wherein the second insulating layer includes a third insulating sub-layer and a fourth insulating sub-layer that are sequentially arranged in a direction away from the base; and in the direction away from the base, a surface, facing away from the base, of the portion of the second electrode disposed within the fourth through hole is lower than a surface of the fourth insulating sub-layer facing away from the base.

10. The driving backplane according to claim 9, wherein the second insulating layer further includes a fifth through hole that is in the sub-pixel region; and the fifth through hole is connected to the second through hole; and the driving backplane further comprises a first conductive adhesive pattern and a second conductive adhesive pattern that are in the sub-pixel region; the first conductive adhesive pattern is disposed within the fourth through hole and is in direct contact with a surface of the second electrode facing away from the base, and the second conductive adhesive pattern is disposed within the fifth through hole and is in direct contact with a surface of the first electrode facing away from the base.

11. The driving backplane according to claim 1, wherein the first through holes in the sub-pixel region include two first through holes, and the driving electrodes in the sub-pixel region are the first electrode and the second electrode.

12. A display panel, comprising:

the driving backplane according to claim 1; and at least one light-emitting device disposed in the sub-pixel region on the driving backplane, wherein each light-emitting device is connected to corresponding driving electrodes.

13. A method for manufacturing the driving backplane according to claim 1, the method comprising:

forming the first through holes in the sub-pixel region in the base;

forming the electroplating electrodes in the sub-pixel region, wherein at least a portion of each electroplating electrode is formed in a respective one of the first through holes; and forming the driving electrodes in the sub-pixel region on the first side of the base by using an electroplating process through the electroplating electrodes, wherein forming the electroplating electrodes includes:

by using a first magnetron sputtering process, forming electroplating electrode seed layers each both on an inner wall of a corresponding first through hole and in a region that surrounds the corresponding first through hole on a surface, at a second side opposite to the first side, of the base; and forming electroplating deposition portions each in a corresponding first through hole by using a first electroplating process through the electroplating electrode seed layers.

14. The method according to claim 13, wherein forming the driving electrodes includes forming the first electrode; and forming the first electrode includes:

forming a metal film through a second magnetron sputtering process on a surface, at the first side, of the base;

performing a first patterning process on the metal film to form a first sub-electrode, wherein an orthographic projection of a respective first through hole on a plane where a surface, at the first side, of the base is located is within an orthographic projection of a first sub-electrode on the plane;

forming a first insulating film on a side of the first sub-electrode away from the base;

performing a second patterning process on the first insulating film to form a second through hole that is in the sub-pixel region, so as to obtain a first insulating film having the second through hole that is in the sub-pixel region; and forming a second sub-electrode in the second through hole by using a second electroplating process through a corresponding electroplating electrode and the first sub-electrode.

15. The method according to claim 14, wherein forming the driving electrodes further includes forming the second electrode; and forming the second electrode includes:

performing at least one third patterning process on the first insulating film and a second insulating film to form, in the sub-pixel region, a first via hole passing through the first insulating film and a second via hole passing through the second insulating film, so as to obtain a first insulating sub-layer, the first via hole and the second via hole constitute a third through hole;

forming a third sub-electrode through a third magnetron sputtering process both on an inner wall of the third through hole and in a region that is on a periphery of the third through hole on the second insulating film;

forming a third insulating film on a side of the third sub-electrode away from the base;

performing a fourth patterning process on the third insulating film to form, in the sub-pixel region, a third via hole passing through the third insulating film, so as to obtain a third insulating film having the third via hole; and forming a fourth sub-electrode in the third via hole by using a third electroplating process through the third sub-electrode and a corresponding electroplating electrode.

16. The method according to claim 15, wherein before the third sub-electrode is formed through the third magnetron sputtering process, the method further comprises:

forming a second insulating film on the first insulating film; and performing at least one third patterning process on the first insulating film and the second insulating film includes:

performing one third patterning process on the first insulating film and the second insulating film, so as to obtain a second insulating sub-layer.

17. The method according to claim 15, wherein after the fourth sub-electrode is formed, the method further comprises:

forming a fourth insulating film on the third insulating film;

performing at least one fifth patterning process on the fourth insulating film and the third insulating film to form, in the sub-pixel region, a fifth through hole passing through both the third insulating film and the fourth insulting film and a fourth via hole passing through the fourth insulating film, wherein the third via hole and the fourth via hole constitute a fourth through hole; and forming a second conductive adhesive pattern in the fifth through hole on the first electrode, and a first conductive adhesive pattern in the fourth via hole on the second electrode.

* * * * *

UNITED STATES PATENT AND TRADEMARK OFFICE
CERTIFICATE OF CORRECTION

| | | |
|---|---|---|
| PATENT NO. | : 11,532,264 B2 | Page 1 of 1 |
| APPLICATION NO. | : 17/081834 | |
| DATED | : December 20, 2022 | |
| INVENTOR(S) | : Ke Wang and Zhanfeng Cao | |

It is certified that error appears in the above-identified patent and that said Letters Patent is hereby corrected as shown below:

In the Specification

In the DETAILED DESCRIPTION, Column 7, Line 55, correct to read as follows:
"As shown in FIGS. 4A and 4B, the base 100 has a plurality..."

In the DETAILED DESCRIPTION, Column 8, Line 8, correct to read as follows:
"As shown in FIGS. 4A and 4B, the driving backplane 10..."

Signed and Sealed this
Twenty-seventh Day of June, 2023

Katherine Kelly Vidal
*Director of the United States Patent and Trademark Office*